(12) United States Patent
Kang et al.

(10) Patent No.: US 9,437,286 B2
(45) Date of Patent: Sep. 6, 2016

(54) MEMORY SYSTEM, METHOD OF PROGRAMMING THE MEMORY SYSTEM, AND METHOD OF TESTING THE MEMORY SYSTEM

(71) Applicant: SAMSUNG ELECTRONICS CO., LTD., Suwon-Si, Gyeonggi-Do (KR)

(72) Inventors: Kyung-Min Kang, Suwon-Si (KR); Dae-Han Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/616,786

(22) Filed: Feb. 9, 2015

(65) Prior Publication Data
US 2015/0294725 A1 Oct. 15, 2015

(30) Foreign Application Priority Data
Apr. 14, 2014 (KR) .......................... 10-2014-0044426

(51) Int. Cl.
| | |
|---|---|
| *G11C 11/56* | (2006.01) |
| *G11C 16/10* | (2006.01) |
| *G11C 16/34* | (2006.01) |
| *G11C 16/04* | (2006.01) |
| *G11C 7/02* | (2006.01) |
| *G11C 16/12* | (2006.01) |
| *G11C 29/12* | (2006.01) |
| *G11C 29/50* | (2006.01) |

(52) U.S. Cl.
CPC .......... *G11C 11/5628* (2013.01); *G11C 16/10* (2013.01); *G11C 16/3459* (2013.01); *G11C 7/02* (2013.01); *G11C 11/5642* (2013.01); *G11C 16/0483* (2013.01); *G11C 16/12* (2013.01); *G11C 2029/1202* (2013.01); *G11C 2029/5002* (2013.01); *G11C 2211/5621* (2013.01)

(58) Field of Classification Search
CPC .............. G11C 16/10; G11C 11/5628; G11C 11/5642; G11C 16/3459
See application file for complete search history.

(56) References Cited

U.S. PATENT DOCUMENTS

| | | | |
|---|---|---|---|
| 7,046,554 B2 | 5/2006 | Lee | |
| 7,257,027 B2 | 8/2007 | Park | |
| 7,433,240 B2 | 10/2008 | Kim | |
| 7,539,062 B2 | 5/2009 | Doyle | |
| 7,768,836 B2 | 8/2010 | Li et al. | |
| 8,111,573 B2 | 2/2012 | Ishihara et al. | |
| 8,310,872 B2 | 11/2012 | Koya et al. | |
| 8,385,131 B2 | 2/2013 | Seol | |
| 2008/0101120 A1 | 5/2008 | Park et al. | |
| 2010/0058003 A1 | 3/2010 | Goto et al. | |
| 2011/0235420 A1* | 9/2011 | Sharon ................ | G11C 11/5642 365/185.17 |

(Continued)

*Primary Examiner* — J. H. Hur
*Assistant Examiner* — Ajay Ojha
(74) *Attorney, Agent, or Firm* — Volentine & Whitt, PLLC

(57) ABSTRACT

A method of programming a memory system includes repetitively performing N program loops for a selected memory cell (where N is a natural number equal to or greater than two). Each of the N program loops includes a program operation and a program verify operation. At least one of the N program loops includes performing the program operation on the selected memory cell and on at least one additionally selected memory cell by applying a program voltage to at least one word line to which the selected memory cell and at least one additionally selected memory cell are connected, and performing the program verify operation on the selected memory cell by applying a program verify voltage to a selected word line to which the selected memory cell is connected.

20 Claims, 35 Drawing Sheets

(56) References Cited

U.S. PATENT DOCUMENTS

2012/0069667 A1* 3/2012 Shirakawa .......... G11C 11/5628
 365/185.17
2013/0238843 A1 9/2013 Kim et al.
2015/0055416 A1* 2/2015 Umezawa .............. G11C 16/10
 365/185.18

* cited by examiner

FIG. 12

| NUMBER OF LOOPS | LOOP 1 | | LOOP 2 | | LOOP 3 | | LOOP 4 | | LOOP 1 | | LOOP 2 | | LOOP 3 | | LOOP 4 | |
|---|---|---|---|---|---|---|---|---|---|---|---|---|---|---|---|---|
| PGM Status | PGM Exe. | Verify | PGM Exe. | Verify | PGM Exe. | Verify | PGM Exe. | Verify | PGM Exe. | Verify | PGM Exe. | Verify | PGM Exe. | Verify | PGM Exe. | Verify |
| SELECTED PAGE | PAGE 1 | | PAGE 1 | | PAGE 1 | | PAGE 1 | | PAGE 2 | | PAGE 2 | | PAGE 2 | | PAGE 2 | |

FIG. 16

|  | LOOP 1 | | LOOP 2 | | LOOP 3 | | LOOP 4 | | LOOP 1 | | LOOP 2 | |
|---|---|---|---|---|---|---|---|---|---|---|---|---|
|  | PGM | Verify | PGM | Verify | PGM | Verify | PGM | Verify | PGM | Verify | PGM | Verify |
| WL1 | O | O | O | O | O | O | O | O | X | X | X | X |
| WL2 | X | X | X | X | X | X | X | X | X | X | X | X |
| WL3 | O | X | O | X | X | X | X | X | O | O | O | O |
| SSL1 | O | O | O | O | O | O | O | O | O | O | O | O |
| SSL2 | X | X | X | X | X | X | X | X | X | X | X | X |

FIG. 17

| | LOOP 1 | | LOOP 2 | | LOOP 3 | | LOOP 4 | | LOOP 1 | | LOOP 2 | |
|---|---|---|---|---|---|---|---|---|---|---|---|---|
| | PGM | Verify | PGM | Verify | PGM | Verify | PGM | Verify | PGM | Verify | PGM | Verify |
| WL1 | Vpgm1 | Vver | Vpgm2 | Vver | Vpgm3 | Vver | Vpgm4 | Vver | Vpass | Vread | Vpass | Vread |
| WL2 | Vpass | Vread | Vpass | Vread | Vpass | Vread | Vpass | Vread | Vpass | Vread | Vpass | Vread |
| WL3 | Vpgm1 | Vread | Vpgm2 | Vread | Vpass | Vread | Vpass | Vread | Vpgm3 | Vver | Vpgm4 | Vver |
| SSL1 | Von | Von | Von | Von | Von | Von | Von | Von | Von | Von | Von | Von |
| SSL2 | Voff | Voff | Voff | Voff | Voff | Voff | Voff | Voff | Voff | Voff | Voff | Voff |

FIG. 19

| | LOOP 1 | | LOOP 2 | | LOOP 3 | | LOOP 4 | | LOOP 1 | | LOOP 2 | |
|---|---|---|---|---|---|---|---|---|---|---|---|---|
| | PGM | Verify | PGM | Verify | PGM | Verify | PGM | Verify | PGM | Verify | PGM | Verify |
| WL1 | O | O | O | O | O | O | O | O | O | O | O | O |
| WL2 | X | X | X | X | X | X | X | X | X | X | X | X |
| SSL1 | O | O | O | O | O | O | O | O | X | X | X | X |
| SSL2 | X | X | X | X | X | X | X | X | X | X | X | X |
| SSL3 | O | X | O | X | X | X | X | X | O | O | O | O |

FIG. 20

|  | LOOP 1 | | LOOP 2 | | LOOP 3 | | LOOP 4 | | LOOP 1 | | LOOP 2 | |
|---|---|---|---|---|---|---|---|---|---|---|---|---|
|  | PGM | Verify | PGM | Verify | PGM | Verify | PGM | Verify | PGM | Verify | PGM | Verify |
| WL1 | Vpgm1 | Vver | Vpgm2 | Vver | Vpgm3 | Vver | Vpgm4 | Vver | Vpgm3 | Vver | Vpgm4 | Vver |
| WL2 | Vpass | Vread | Vpass | Vread | Vpass | Vread | Vpass | Vread | Vpass | Vread | Vpass | Vread |
| SSL1 | (Von) | Von | (Von) | Von | Von | Von | Von | Von | Voff | Voff | Voff | Voff |
| SSL2 | Voff | Voff | Voff | Voff | Voff | Voff | Voff | Voff | Voff | Voff | Voff | Voff |
| SSL3 | (Von) | Voff | (Von) | Voff | Voff | Voff | Voff | Voff | (Von) | Voff | (Von) | Voff |

FIG. 23

|  | LOOP 1 | | LOOP 2 | | LOOP 3 | | LOOP 4 | | LOOP 5 | | LOOP 6 | |
|---|---|---|---|---|---|---|---|---|---|---|---|---|
|  | PGM | Verify | PGM | Verify | PGM | Verify | PGM | Verify | PGM | Verify | PGM | Verify |
| WL1 | ○ | ○ | ○ | ○ | × | × | × | × | ○ | ○ | ○ | ○ |
| WL2 | × | × | × | × | × | × | × | × | × | × | × | × |
| WL3 | ○ | × | ○ | × | ○ | ○ | ○ | ○ | × | × | × | × |
| SSL1 | ○ | ○ | ○ | ○ | ○ | ○ | ○ | ○ | ○ | ○ | ○ | ○ |
| SSL2 | × | × | × | × | × | × | × | × | × | × | × | × |

FIG. 24

|  | LOOP 1 | | LOOP 2 | | LOOP 3 | | LOOP 4 | | LOOP 5 | | LOOP 6 | |
|---|---|---|---|---|---|---|---|---|---|---|---|---|
|  | PGM | Verify | PGM | Verify | PGM | Verify | PGM | Verify | PGM | Verify | PGM | Verify |
| WL1 | Vpgm1 | Vver | Vpgm2 | Vver | Vpgm3 | Vread | Vpgm4 | Vread | Vpgm3 | Vver | Vpgm4 | Vver |
| WL2 | Vpass | Vread | Vpass | Vread | Vpass | Vread | Vpass | Vread | Vpass | Vread | Vpass | Vread |
| WL3 | Vpgm1 | Vread | Vpgm2 | Vread | Vpgm3 | Vver | Vpgm4 | Vver | Vpass | Vread | Vpass | Vread |
| SSL1 | Von | Von | Von | Von | Von | Voff | Von | Voff | Von | Von | Von | Von |
| SSL2 | Voff | Voff | Voff | Voff | Voff | Voff | Voff | Voff | Voff | Voff | Voff | Voff |

FIG. 26

|  | LOOP 1 | | LOOP 2 | | LOOP 3 | | LOOP 4 | | LOOP 5 | | LOOP 6 | |
| --- | --- | --- | --- | --- | --- | --- | --- | --- | --- | --- | --- | --- |
|  | PGM | Verify | PGM | Verify | PGM | Verify | PGM | Verify | PGM | Verify | PGM | Verify |
| WL1 | O | O | O | O | O | O | O | O | O | O | O | O |
| WL2 | X | X | X | X | X | X | X | X | X | X | X | X |
| SSL1 | O | O | O | O | X | X | X | X | O | O | O | O |
| SSL2 | X | X | X | X | X | X | X | X | X | X | X | X |
| SSL3 | O | X | O | X | O | O | O | O | X | X | X | X |

FIG. 27

| | LOOP 1 | | LOOP 2 | | LOOP 3 | | LOOP 4 | | LOOP 5 | | LOOP 6 | |
|---|---|---|---|---|---|---|---|---|---|---|---|---|
| | PGM | Verify | PGM | Verify | PGM | Verify | PGM | Verify | PGM | Verify | PGM | Verify |
| WL1 | Vpgm1 | Vver | Vpgm2 | Vver | Vpgm3 | Vver | Vpgm4 | Vver | Vpgm3 | Vver | Vpgm4 | Vver |
| WL2 | Vpass | Vread | Vpass | Vread | Vpass | Vread | Vpass | Vread | Vpass | Vread | Vpass | Vread |
| SSL1 | Von | Von | Von | Von | Voff | Von | Voff | Voff | Voff | Von | Von | Von |
| SSL2 | Voff | Voff | Voff | Voff | Voff | Voff | Voff | Von | Von | Voff | Voff | Voff |
| SSL3 | Von | Voff | Von | Voff | Von | Von | Von | Von | Voff | Voff | Voff | Voff |

FIG. 31

|  | LOOP 1 | | LOOP 2 | | LOOP 3 | | LOOP 4 | | LOOP 1 | | LOOP 2 | |
|---|---|---|---|---|---|---|---|---|---|---|---|---|
|  | PGM | Verify | PGM | Verify | PGM | Verify | PGM | Verify | PGM | Verify | PGM | Verify |
| WL1 | (Vpgm) | Vver | Vpgm | Vver | Vpgm | Vver | Vpgm | Vver | Vpass | Vread | Vpass | Vread |
| WL2 | Vera | Vread | Vera | Vread | Vera | Vread | Vera | Vread | Vera | Vread | Vera | Vread |
| WL3 | (Vpgm) | Vread | (Vpgm) | Vread | Vpass | Vread | Vpass | Vread | (Vpgm) | Vver | (Vpgm) | Vver |
| SSL1 | Von | Von | Von | Von | Von | Von | Von | Von | Von | Von | Von | Von |
| SSL2 | Voff | Voff | Voff | Voff | Voff | Voff | Voff | Voff | Voff | Voff | Voff | Voff |

FIG. 32

|  | LOOP 1 | | LOOP 2 | | LOOP 3 | | LOOP 4 | | LOOP 1 | | LOOP 2 | |
| --- | --- | --- | --- | --- | --- | --- | --- | --- | --- | --- | --- | --- |
|  | PGM | Verify | PGM | Verify | PGM | Verify | PGM | Verify | PGM | Verify | PGM | Verify |
| WL1 | Vpgm | Vver | Vpgm | Vver | Vpgm | Vver | Vpgm | Vver | Vpgm | Vver | Vpgm | Vver |
| WL2 | Vera | Vread | Vera | Vread | Vera | Vread | Vera | Vread | Vera | Vread | Vera | Vread |
| SSL1 | (Von) | Von | Von | Von | Von | Von | (Von) | Von | Voff | Voff | Voff | Voff |
| SSL2 | Voff | Voff | (Von) | Voff | Voff | Voff | Voff | Voff | Voff | Voff | Voff | Voff |
| SSL3 | (Von) | Voff | Voff | Voff | Voff | Voff | Voff | Voff | (Von) | Von | (Von) | Von |

MEMORY SYSTEM, METHOD OF PROGRAMMING THE MEMORY SYSTEM, AND METHOD OF TESTING THE MEMORY SYSTEM

CROSS-REFERENCE TO RELATED APPLICATION

A claim for priority under 35 U.S.C. §119 is made to Korean Patent Application No. 10-2014-0044426, filed on Apr. 14, 2014, the entire contents of which are hereby incorporated by reference.

BACKGROUND

The present inventive concept relates to a memory system, and more particularly, to a method of programming a memory system, and a method of testing a memory system.

Of the various semiconductor memory devices, non-volatile memory devices include a plurality of memory cells that store data in a non-volatile manner. Flash memory devices, which are a type of a non-volatile memory device, may be used in mobile phones, digital cameras, personal digital assistants (PDA), portable computer devices, stationary computer devices, and other devices.

SUMMARY

Embodiments of the inventive concept provide a method of programming a memory system. The method includes repetitively performing N program loops for a selected memory cell, where N is a natural number equal to or greater than 2. Each of the N program loops includes a program operation and a program verify operation. At least one of the N program loops includes performing the program operation on the selected memory cell and on at least one additionally selected memory cell by applying a program voltage to at least one word line to which the selected memory cell and at least one additionally selected memory cell are connected. At least one of the N program loops also includes performing the program verify operation on the selected memory cell by applying a program verify voltage to a selected word line to which the selected memory cell is connected.

In some embodiments of the inventive concept, at least one word line may include the selected word line to which the selected memory cell is connected, and at least one additionally selected word line to which at least one additionally selected memory cell is connected. In some embodiments, the selected word line and at least one additionally selected word line may not be disposed adjacent to each other. In other embodiments, the selected word line and at least one additionally selected word line may be disposed adjacent to each other.

In some embodiments of the inventive concept, the selected memory cell and at least one additionally selected memory cell may be commonly connected to the selected word line. Performing the program operation may include applying an on-voltage to a plurality of string select lines to which the selected memory cell and at least one additionally selected memory cell are connected.

In some embodiments of the inventive concept, the plurality of string select lines may include a selected string select line to which the selected memory cell is connected; and at least one additionally selected string select line to which at least one additionally selected memory cell is connected. Performing the program verify operation may include applying an on-voltage to the selected string select line and applying an off-voltage to at least one additionally selected string select line. In some embodiments, the selected string select line and at least one additionally selected string select line may not be disposed adjacent to each other. In other embodiments, the selected string select line and at least one additionally selected string select line may be disposed adjacent to each other.

In some embodiments of the inventive concept, at least one additionally selected memory cell may be a plurality of additionally selected memory cells. At least one word line may include the selected word line to which the selected memory cell and some of the plurality of additionally selected memory cells are connected, and at least one additionally selected word line to which remaining ones of the plurality of additionally selected memory cells are connected. Performing the program operation may include applying an on-voltage to a plurality of string select lines to which the selected memory cell and the plurality of additionally selected memory cells are connected.

In some embodiments of the inventive concept, the plurality of string select lines may include a selected string select line to which the selected memory cell is connected, and at least one additionally selected string select line connected to at least one additionally selected memory cell that is not connected to the selected string select line among the plurality of additionally selected memory cells. Performing the program verify operation may include applying an on-voltage to the selected string select line, and applying an off-voltage to at least one additionally selected string select line.

In some embodiments of the inventive concept, program loops other than at least one of the N program loops may include performing a program operation on the selected memory cell by applying the program voltage to the selected word line, and performing a program verify operation on the selected memory cell by applying the program verify voltage to the selected word line.

In some embodiments of the inventive concept, the method may further include, when the N program loops for the selected memory cell are completed, repetitively performing M program loops on at least one additionally selected memory cell. When the program operation is performed on the selected memory cell and at least one additionally selected memory cell L times, M may be equal to (N−L).

In some embodiments of the inventive concept, program loops other than at least one of the N program loops may include performing a program operation on at least one additionally selected memory cell by applying the program voltage to at least one additionally selected word line to which at least one additionally selected memory cell is connected, performing a program verify operation on at least one additionally selected memory cell by applying the program verify voltage to the additionally selected word line, performing a re-program operation on the selected memory cell by applying the program voltage to the selected word line, and performing a re-program verify operation on the selected memory cell by applying the program verify voltage to the selected word line.

In some embodiments of the inventive concept, as the number (N) of the program loops increases, the program voltage may increase stepwise by a step voltage.

According to other embodiments of the inventive concept, there is provided a method of testing a memory system. The method includes performing a test program operation on a selected memory cell and at least one additionally selected memory cell by applying a test program voltage to at least one word line to which the selected memory cell and at least one additionally selected memory cell are connected, and performing a test program verify operation on the selected memory cell by applying a test program verify voltage to an additionally selected word line to which the selected memory cell is connected.

In some embodiments of the inventive concept, at least one word line may include the selected word line to which the selected memory cell is connected, and at least one additionally selected word line to which at least one additionally selected memory cell is connected. The selected word line and at least one additionally selected word line may be alternately disposed.

In some embodiments of the inventive concept, the selected memory cell and at least one additionally selected memory cell may be commonly connected to the selected word line. Performing the test program operation may include applying an on-voltage to a plurality of string select lines to which the selected memory cell and at least one additionally selected memory cell are connected. The plurality of string select lines may include a selected string select line to which the selected memory cell is connected, and at least one additionally selected string select line to which at least one additionally selected memory cell is connected and which is alternately disposed with the selected string select line. Performing the test program verify operation may include applying an on-voltage to the selected string select line, and applying an off-voltage to at least one additionally selected string select line.

According to other embodiments of the inventive concept, there is provided a memory system. The memory system may include a memory device including a selected memory cell and at least one additionally selected memory cell. The memory system may also include a memory controller configured to control the memory device so that at least one of N program loops for the selected memory cell, where N is a natural number equal to or greater than 2, includes a program operation simultaneously performed on the selected memory cell and on at least one additionally selected memory cell, and a program verify operation performed on only the selected memory cell.

In some embodiments of the inventive concept, the memory controller may include a read/write control unit configured to provide an address of the selected memory cell, an address of at least one additionally selected memory cell, and a program command in the program operation. The read/write control unit may also provide the address of the selected memory cell and a program verify command in the program verify operation.

In some embodiments of the inventive concept, when the N program loops for the selected memory cell are completed, the read/write control unit may provide the address of at least one additionally selected memory cell and the program command in a next program operation, and provide the address of at least one additionally selected memory cell and the program verify command in a next program verify operation.

BRIEF DESCRIPTION OF THE DRAWINGS

Exemplary embodiments of the inventive concept will be more clearly understood from the following detailed description taken in conjunction with the accompanying drawings in which:

FIG. 12 is a diagram illustrating an example of a program operation of the memory block of FIG. 10 or the memory block of FIG. 11.

FIG. 16 is a diagram illustrating whether a program operation is performed for each page of FIG. 10, according to the multi-program operation of FIG. 15.

FIG. 17 is a diagram illustrating voltage conditions of word lines and string select lines of FIG. 10, according to the multi-program operation of FIG. 15.

FIG. 19 is a diagram illustrating whether a program operation is performed for each page of FIG. 10, according to the multi-program operation of FIG. 18.

FIG. 20 is a diagram illustrating voltage conditions of word lines and string select lines of FIG. 10, according to the multi-program operation of FIG. 18.

FIG. 23 is a diagram illustrating whether a program operation is performed for each page of FIG. 10, according to the multi-program operation of FIG. 22.

FIG. 24 is a diagram illustrating voltage conditions of word lines and string select lines of FIG. 10, according to the multi-program operation of FIG. 22.

FIG. 26 is a diagram illustrating whether a program operation is performed for each page of FIG. 10, according to the multi-program operation of FIG. 25.

FIG. 27 is a diagram illustrating voltage conditions of word lines and string select lines of FIG. 10, according to the multi-program operation of FIG. 25.

FIG. 31 is a diagram illustrating voltage conditions of word lines and string select lines of FIG. 10, according to the testing method of FIG. 30.

FIG. 32 is a diagram illustrating voltage conditions of word lines and string select lines of FIG. 10, according to another embodiment of the testing method of FIG. 30.

DETAILED DESCRIPTION

Figure 1:
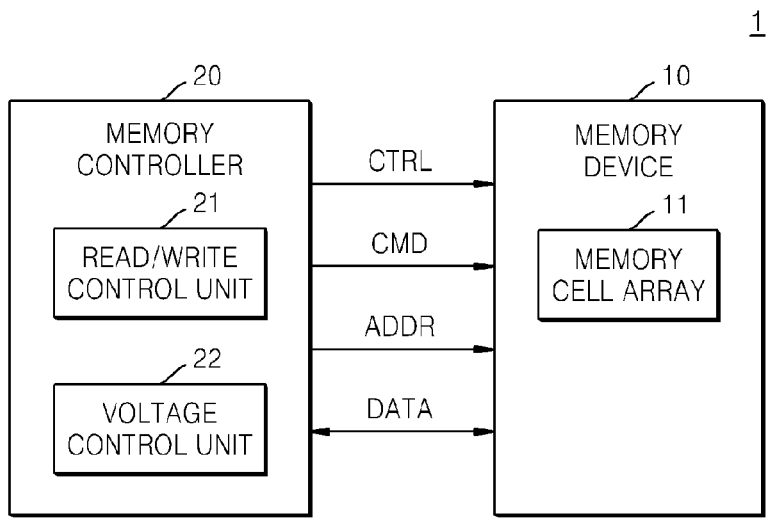
FIG. 1 is a schematic block diagram of a memory system according to an embodiment of the inventive concept.

Hereinafter, embodiments of the inventive concept will be described with reference to the accompanying drawings. The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art. It should be understood, however, that there is no intent to limit the inventive concept to the particular forms disclosed, but on the contrary, the present disclosure is to cover all modifications, equivalents, and alternatives falling within the spirit and scope of the inventive concept. Like reference numerals denote like elements throughout the specification and drawings. In the drawings, the dimensions of structures are exaggerated for clarity of the inventive concept.

The terms used herein is for the purpose of describing particular embodiments only and is not intended to be limiting of the inventive concept. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Though terms like "first" and "second" are used to describe various members, components, regions, layers, and/or portions in various embodiments of the inventive concept, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment can be referred to as a second member, a second component, a second region, a second layer, or a second portion in another embodiment.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Expressions such as "at least one of" when preceding a list of elements, modify the entire list of elements and do not modify the individual elements of the list.

FIG. 1 is a schematic block diagram of a memory system 1 according to an embodiment of the inventive concept.

Referring to FIG. 1, the memory system 1 may include a memory device 10 and a memory controller 20. The memory device 10 may include a memory cell array 11. The memory controller 20 may include a read/write control unit 21 and a voltage control unit 22. Hereinafter, elements included in the memory device 10 and the memory controller 20 will be described in detail.

The memory cell array 11 may include a plurality of memory cells (not illustrated) arranged in regions where a plurality of word lines (WL of FIG. 2) and a plurality of bit lines (BL of FIG. 2) are intersected with one another. In some embodiments, the plurality of memory cells may be flash memory cells, and the memory cell array 11 may be a NAND flash memory cell array or a NOR flash memory cell array.

Hereinafter, assuming that the plurality of memory cells are NAND flash memory cells, embodiments of the inventive concept will be described in detail. In some embodiments, the plurality of memory cells may be three-dimensional vertical NAND (VNAND) flash memory cells (see FIGS. 4 to 10). In some embodiments, the plurality of memory cells may be two-dimensional horizontal NAND flash memory cells (see FIG. 11). However, the inventive concept is not limited thereto. In some embodiments, the plurality of memory cells may be resistive memory cells, such as resistive RAM (RRAM) memory cells, phase change RAM (PRAM) memory cells, or magnetic RAM (MRAM) memory cells.

The memory controller 20 may perform a control operation on the memory device 10. Specifically, the memory controller 20 may control program (or write), read and erase operations on the memory device 10 by providing the memory device 10 with an address ADDR, a command CMD, and a control signal CTRL. In addition, data DATA for the program operation and read data DATA may be transmitted and received between the memory controller 20 and the memory device 10.

The read/write control unit 21 may provide an address ADD and a command CMD for performing the program, read and erase operations on the memory cell array 11. In the present embodiment, the read/write control unit 21 may provide an address ADD and a command CMD for performing a multi-program operation on the memory device 10.

Specifically, in the program operation, the read/write control unit 21 may provide an address of a selected memory cell to be programmed, an address of an additionally selected memory cell to be programmed at the same time as the selected memory cell, and a program command in at least one of N program loops (where N is a natural number equal to or greater than 2). As such, the memory system 1 may perform the multi-program operation on the selected memory cell and the additionally selected memory cell among the memory cells included in the memory cell array 11. A total program time may be decreased since the program operation is simultaneously performed on the selected memory cell and the additionally selected memory cell.

In a program verify operation, the read/write control unit 21 may provide the address of the selected memory cell to be programmed and a program verify command in at least one of the N program loops. Even though the program operation is simultaneously performed on the selected memory cell and the additionally selected memory cell, the read/write control unit 21 may perform the program verify operation on only the selected memory cell. Therefore, in case that the program operation on the selected memory cell has been completed and the program operation on the additionally selected memory cell has not been completed, it is possible to prevent such a case from being determined as a "fail" since the program verify operation on the selected memory cell is not correctly performed on the additionally selected memory cell.

When the N program loops are completed, the read/write control unit 21 may provide the address of the additionally selected memory cell to be programmed, and the program command in the next program operation. Then, the read/write control unit 21 may provide the address of the additionally selected memory cell to be programmed, and the program verify command in the next program verify operation.

The voltage control unit 22 may provide a control signal CTRL that controls at least one voltage level used in the memory device 10. For example, the voltage control unit 22 may provide the control signal CTRL that controls a voltage level of a word line WL so as to read data DATA from the memory cell array 11 or program data DATA to the memory cell array 11. Specifically, when the N program loops are executed, the voltage control unit 22 may provide a program voltage that increases stepwise by a step voltage as the number of the program loops increases.

Figure 2:
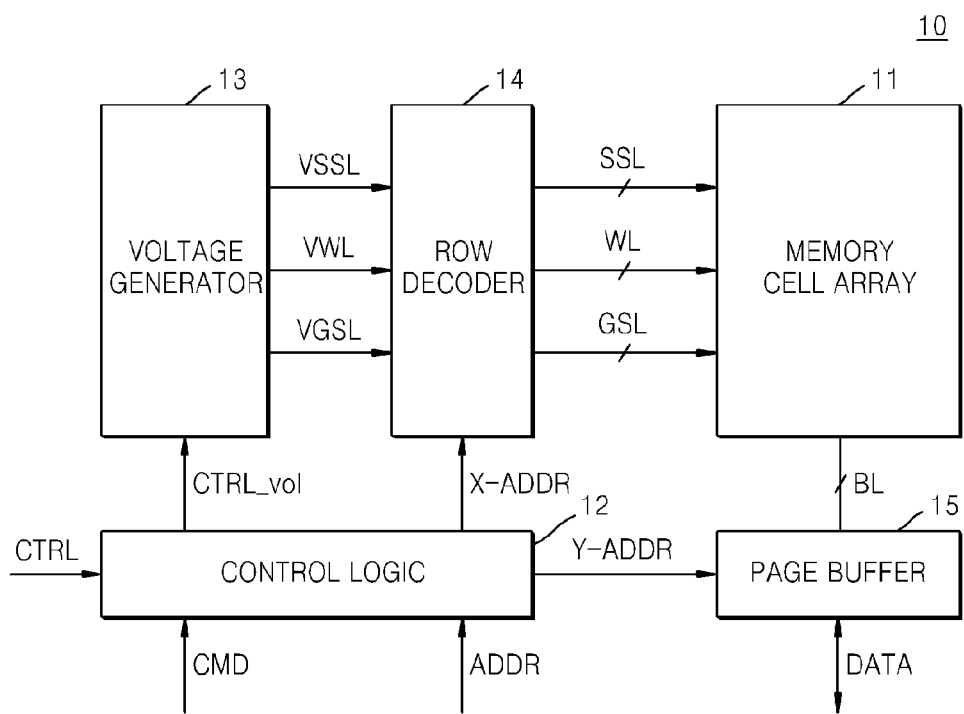
FIG. 2 is a detailed block diagram of a memory device included in the memory system of FIG. 1.

FIG. 2 is a detailed block diagram of the memory device 10 included in the memory system 1 of FIG. 1.

Referring to FIG. 2, the memory device 10 may include a memory cell array 11, a control logic 12, a voltage generator 13, a row decoder 14, and a page buffer 15. Hereinafter, elements included in the memory device 10 will be described in detail.

The memory cell array 11 may be connected to one or more string select lines SSL, a plurality of word lines WL, and one or more ground select lines GSL. The memory cell array 11 may also be connected to a plurality of bit lines BL. The memory cell array 11 may include a plurality of memory cells (MC of FIG. 4, or MC of FIG. 11) arranged in regions where the plurality of word lines WL and the plurality of bit lines BL are intersected with one another.

When an erase voltage Vera is applied to the memory cell array 11, the plurality of memory cells MC become erased, and when a program voltage Vpgm is applied to the memory cell array 11, the plurality of memory cells MC become programmed. At this time, each of the plurality of memory cells MC may be in one of an erased state E and first to n-th program states P1 to Pn that are distinguished from one another according to a threshold voltage Vth.

Herein, n may be a natural number equal to or greater than 3. For example, when the memory cell MC is a 2-bit level cell, n may be equal to 3. In another example, when the memory cell MC is a 3-bit level cell, n may be equal to 7. In another example, when the memory cell MC is a 4-bit level cell, n may be equal to 15. As such, the plurality of memory cells MC may include multi-level cells. However, the present disclosure is not limited thereto. The plurality of memory cells MC may include single-level cells.

The control logic 12 may output various control signals for writing data to the memory cell array 11 or reading data from the memory cell array 11, based on the command CMD, the address ADDR, and the control signal CTRL that are received from the memory controller 20. The control logic 12 may control the overall operation of the memory device 10.

The various control signals that are output from the control logic 12 may be provided to the voltage generator 13, the row decoder 14, and the page buffer 15. Specifically, the control logic 12 may provide the voltage generator 13 with a voltage control signal CTRL_vol, may provide the row decoder 14 with a row address X_ADDR, and may provide the page buffer 15 with a column address Y_ADDR.

The voltage generator 13 may generate various voltages for performing program, read and erase operations on the memory cell array 11, based on the voltage control signal CTRL_vol. Specifically, the voltage generator 13 may generate a first driving voltage VWL for driving the plurality of word lines WL, a second driving voltage VSSL for driving one or more string select lines SSL, and a third driving voltage VGSL for driving one or more ground select lines GSL.

In this case, the first driving voltage VWL may be a program voltage (or write voltage) Vpgm, a read voltage Vread, an erase voltage Vera, a pass voltage Vpass, or a program verify voltage Vver. The second driving voltage VSSL may be a string select voltage, that is, an on-voltage Von or an off-voltage Voff. Moreover, the third driving voltage VGSL may be a ground select voltage, that is, an on-voltage Von or an off-voltage Voff.

In the present embodiment, when the program loop is started, that is, when the number k of the program loops is 1, the voltage generator 13 may generate a program start voltage Vstart as the program voltage Vpgm, based on the voltage control signal CTRL_vol. In addition, as the number k of the program loops increases, the voltage generator 13 may generate a voltage that increases from the program start voltage Vstart by the step voltage Vstep stepwise (that is, Vstart+(k−1)*Vstep).

The row decoder 14 may be connected to the memory cell array 11 through the plurality of word lines WL, and may activate ones of the plurality of word lines WL in response to the row address X_ADDR received from the control logic 12. Specifically, in a read operation, the row decoder 14 may apply the read voltage Vread to a selected word line and may apply the pass voltage Vpass to an unselected word line.

On the other hand, in a program operation, the row decoder 14 may apply the program voltage Vpgm to a selected word line and may apply the pass voltage Vpass to an unselected word line. In the present embodiment, in at least one of the N program loops, the row decoder 14 may apply the program voltage Vpgm to a selected word line and an additionally selected word line.

The page buffer 15 may be connected to the memory cell array 11 through the plurality of bit lines BL. Specifically, in a read operation, the page buffer 15 may operate as a sense amplifier to output data DATA stored in the memory cell array 11. On the other hand, in a program operation, the page buffer 15 may operate as a write driver to write data DATA to the memory cell array 11.

Figure 3:
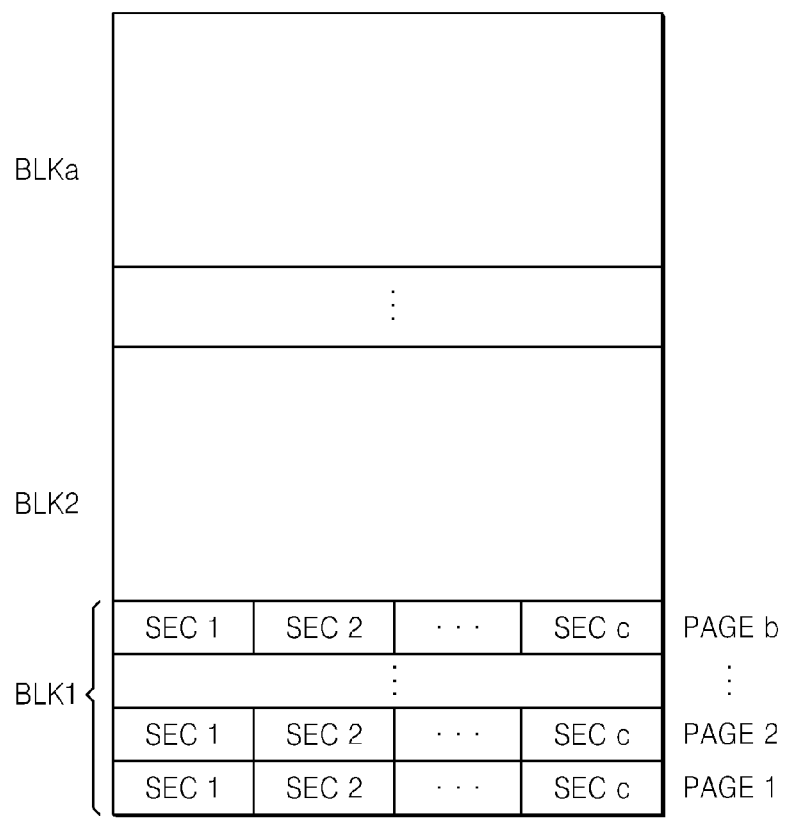
FIG. 3 is a diagram illustrating an example of a memory cell array included in the memory device of FIG. 2.

FIG. 3 is a diagram illustrating an example of the memory cell array 11 included in the memory device 10 of FIG. 2.

Referring to FIG. 3, the memory cell array 11 may be a flash memory cell array. The memory cell array 11 may include "a" memory blocks BLK1 to BLKa (where "a" is an integer equal to or greater than 2). Each of the memory blocks BLK1 to BLKa may include "b" pages PAGE1 to PAGEb (where "b" is an integer equal to or greater than 2). Each of the pages PAGE1 to PAGEb may include "c" sectors SEC1 to SECc (where "c" is an integer equal to or greater than 2). Only the pages PAGE1 to PAGEb and the sectors SEC1 to SECc of the memory block BLK1 are illustrated in FIG. 3, but the other memory blocks BLK2 to BLKa may have the same structure as the block BLK1.

Figure 4:
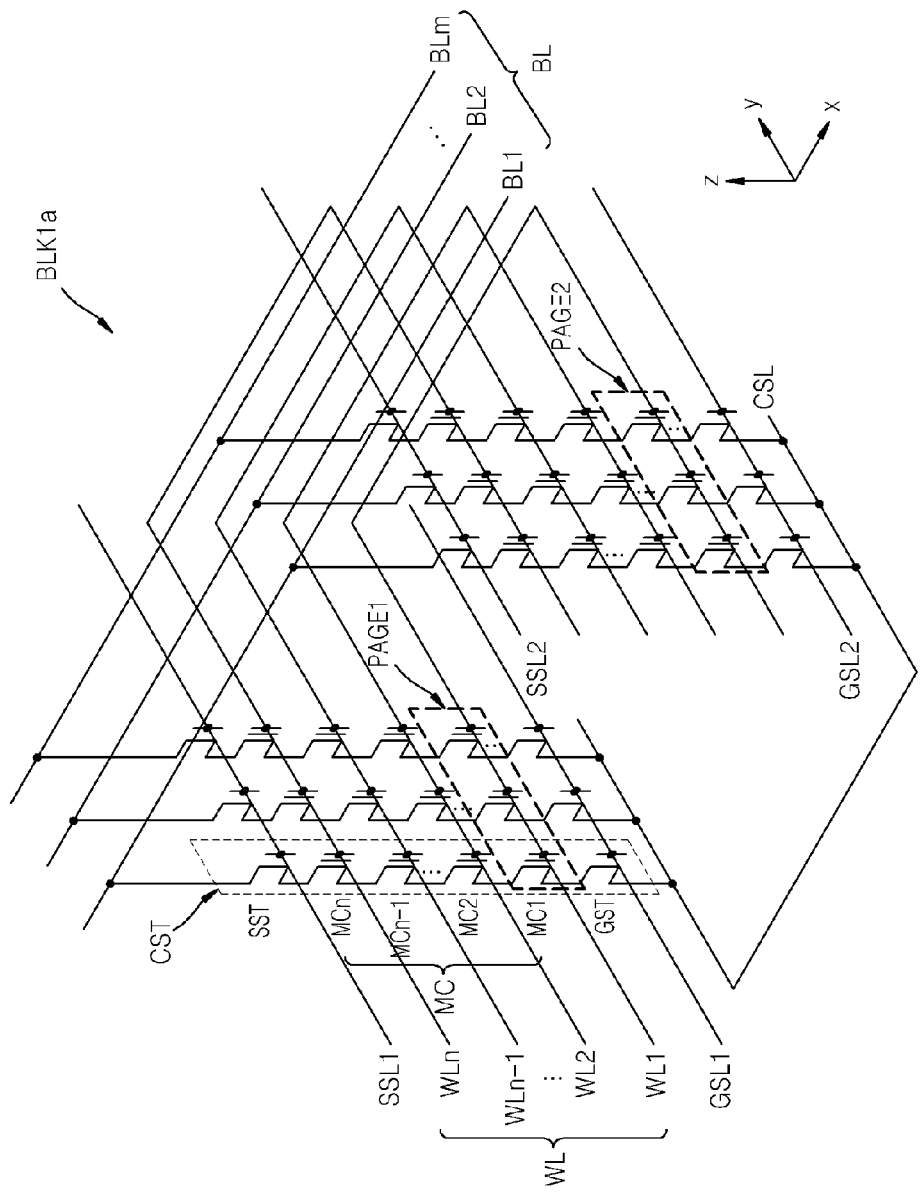
FIG. 4 is a circuit diagram illustrating an example of a first memory block included in the memory cell array of FIG. 3.

FIG. 4 is a circuit diagram illustrating an example BLK1a of a first memory block included in the memory cell array 11 of FIG. 3.

Referring to FIG. 4, the first memory block BLK1a may be a VNAND flash memory. Each of the memory blocks BLK1 to BLKa illustrated in FIG. 3 may be implemented as illustrated in FIG. 4. In FIG. 4, it is assumed that a first direction, a second direction, and a third direction are indicated as an x direction, a y direction, and a z direction, respectively. However, the inventive concept is not limited thereto. The first to third directions may be changed.

The first memory block BLK1a may include a plurality of cell strings CST, a plurality of word lines WL, a plurality of bit lines BL, a plurality of ground select lines GSL1 and GSL2, a plurality of string select lines SSL1 and SSL2, and a common source line CSL. The number of the cell strings CST, the number of the word lines WL, the number of the bit lines BL, the number of the ground select lines GSL1 and GSL2, and the number of the string select lines SSL1 and SSL2 may be variously changed according to embodiments.

The cell string CST may include a string select transistor SST, a plurality of memory cells MC, and a ground select transistor GST, which are connected in series between a corresponding bit line BL and a corresponding common source line CSL. However, the inventive concept is not limited thereto. In another embodiment, the cell string CST may further include at least one dummy cell. In another embodiment, the cell string CST may include at least two string select transistors or at least two ground select transistors.

In addition, the cell string CST may extend in the third direction (z direction). Specifically, the cell string CST may extend in a direction (z direction) perpendicular to a substrate (110 of FIG. 5). Therefore, the memory block BLK1a including the cell string CST may also be referred to as a VNAND flash memory. The extension of the cell string CST in the direction (z direction) perpendicular to the substrate may increase the degree of integration of the memory cell array 11.

The plurality of word lines WL may extend in the first direction (x direction) and the second direction (y direction). Each of the plurality of word lines WL may be connected to the corresponding memory cells MC. Therefore, the plurality of memory cells MC arranged adjacent to one another on the same layer along the first direction (x direction) and the second direction (y direction) may be connected to the same word line WL. Specifically, each of the plurality of word lines WL may be connected to gates of the memory cells MC in order to control the memory cells MC. The plurality of memory cells MC may store data, and may program, read or write data according to the control of the word line WL connected thereto.

The plurality of bit lines BL may extend in the first direction (x direction) and be connected to the string select transistors SST. Therefore, the plurality of string select transistors SST arranged adjacent to one another along the first direction (x direction) may be connected to the same bit line BL. Specifically, each of the plurality of bit lines BL may be connected to drains of the string select transistors SST.

The plurality of string select lines SSL1 and SSL2 may extend in the second direction (y direction) and be connected to the string select transistors SST. Therefore, the plurality of string select transistors SST arranged adjacent to one another along the second direction (y direction) may be connected to the same string select line SSL1 or SSL2. Specifically, each of the plurality of string select line SSL1 or SSL2 may be connected to gates of the string select transistors SST in order to control the string select transistors SST.

The plurality of ground select lines GSL1 and GSL2 may extend in the second direction (y direction) and be connected to the ground select transistors GST. Therefore, the plurality of ground select transistors GST arranged adjacent to one another along the second direction (y direction) may be connected to the same ground select line GSL1 or GSL2. Specifically, each of the plurality of ground select lines GSL1 or GSL2 may be connected to gates of the ground select transistors GST in order to control the ground select transistors GST.

In addition, the ground select transistors GST included in the respective cell strings CST may be commonly connected to the common source line CSL. Specifically, the common source line CSL may be connected to sources of the ground select transistors GST.

The plurality of memory cells MC, which are commonly connected to the same word line WL and the same string select line SSL1 or SSL2 and are arranged adjacent to one another along the second direction (y direction), may also be referred to as a page. For example, the plurality of memory cells MC, which are commonly connected to the first word line WL1, are commonly connected to the first string select line SSL1, and are arranged adjacent to one another along the second direction (y direction), may be referred to as a first page PAGE1. In addition, the plurality of memory cells MC, which are commonly connected to the first word line WL1, are commonly connected to the second string select line SSL2, and are arranged adjacent to one another along the second direction (y direction), may be referred to as a second page PAGE2.

In order to perform a program operation on the memory cells MC, 0 V, an on-voltage Von, and an off-voltage Voff may be applied to the bit line BL, the string select line SSL, and the ground select line GSL, respectively. The on-voltage Von may be equal to or higher than a threshold voltage of the string select transistor SST so as to turn on the string select transistor SST, and the off-voltage may be equal to or lower than a threshold voltage of the ground select transistor GST so as to turn off the ground select transistor GST. Furthermore, the program voltage Vpgm may be applied to a selected memory cell among the memory cells MC, and the pass voltage Vpass may be applied to the other memory cells. When the program voltage Vpgm is applied, charges may be injected into the memory cells MC by F-N tunneling. The pass voltage Vpass may be higher than the threshold voltage of the memory cells MC.

In order to perform an erase operation on the memory cells MC, an erase voltage Verase may be applied to a body of the memory cells MC, and 0 V may be applied to the word lines WL. Therefore, data of the memory cells MC may be simultaneously erased.

Figure 5:
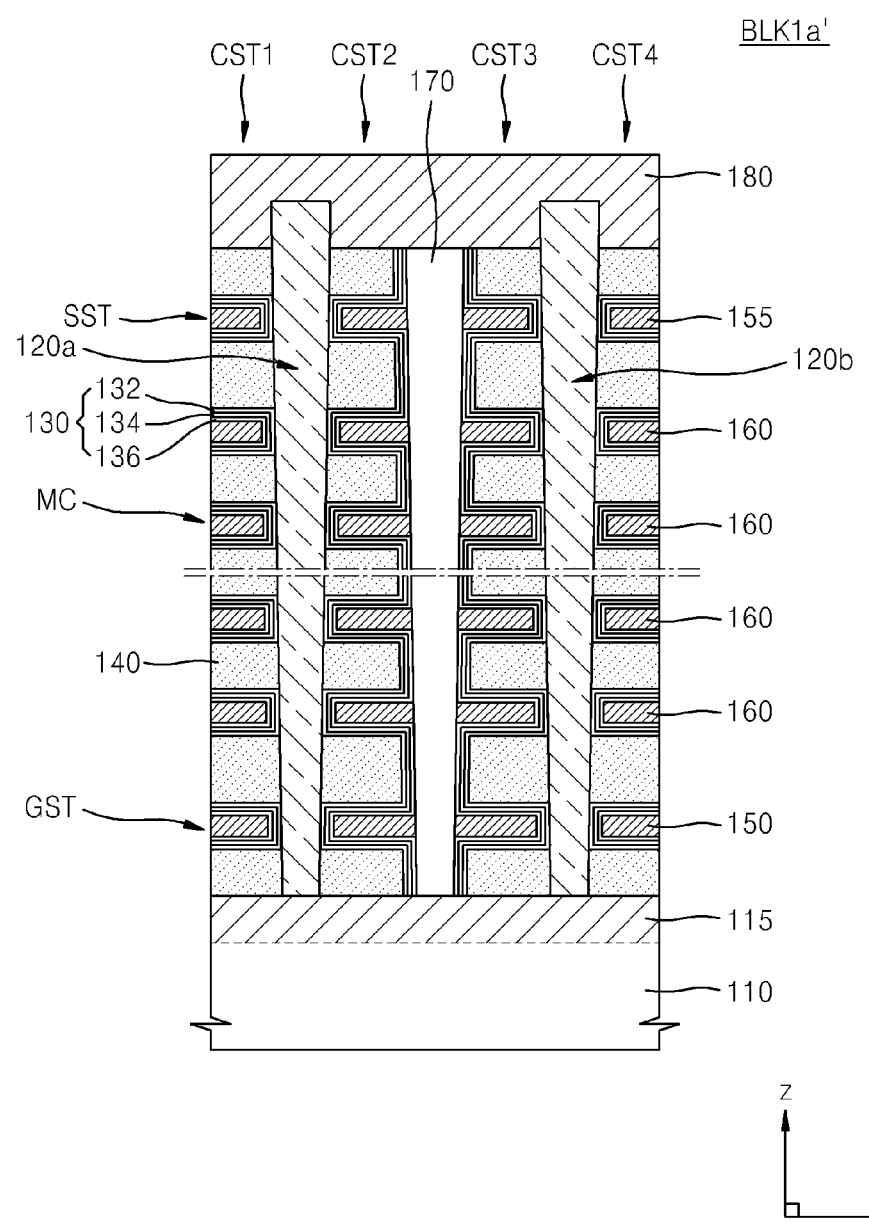
FIG. 5 is a cross-sectional view illustrating an example the first memory block of FIG. 4, taken along a bit line direction.
Figure 6:
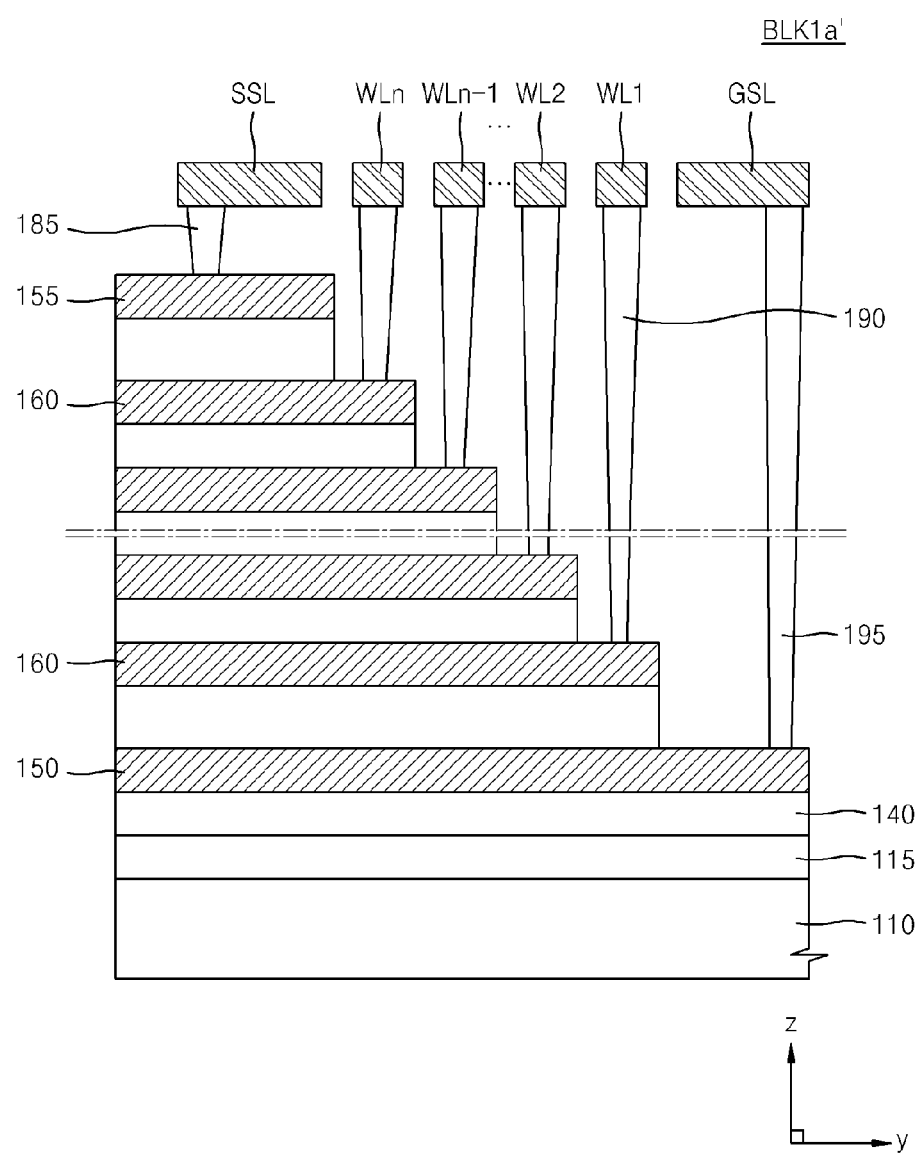
FIG. 6 is a cross-sectional view illustrating an example of the first memory block of FIG. 4, taken along a word line direction.

FIG. 5 is a cross-sectional view illustrating an example BLK1a' of the first memory block of FIG. 4, taken along a bit line direction. FIG. 6 is a cross-sectional view illustrating the example BLK1a' of the first memory block of FIG. 4, taken along a word line direction.

Referring to FIGS. 5 and 6, the first memory block BLK1a' may include a substrate 110 having a main surface extending in a first direction (x direction). The substrate 110 may include a semiconductor material, for example, a group IV semiconductor, a group III-V compound semiconductor, or a group II-VI oxide semiconductor. Examples of the group IV semiconductor may include silicon, germanium, and silicon-germanium. In this case, the substrate 110 may include a bulk wafer or an epitaxial layer.

Semiconductor pillars 120a and 120b may be arranged on the substrate 110 in order to vertically extend from the substrate 110. The semiconductor pillars 120a and 120b may include a semiconductor material, such as polysilicon or single crystal silicon. The semiconductor material may include undoped impurities, p-type impurities, or n-type impurities.

The substrate 110 may include an impurity region 115 under the semiconductor pillars 120a and 120b. The impurity region 115 may become a source region or may form a PN junction with another region of the substrate 110. The common source line CSL of FIG. 4 may be connected to the impurity region 115. In another embodiment, the impurity region 115 may be limited to the bottoms of the semiconductor pillars 120a and 120b.

Each of the memory cells MC may include a storage medium 130 on a sidewall of the semiconductor pillar 120a or 120b, and a control gate electrode 160 on the storage medium 130. The storage medium 130 may include a tunneling insulation layer 132 on the sidewall of the semiconductor pillar 120a or 120b, a charge storage layer 134 on the tunneling insulation layer 132, and a blocking insulation layer 136 on the charge storage layer 134.

The charge storage layer 134 may have a charge storage ability. For example, the charge storage layer 134 may have a trap type structure. For example, the charge storage layer 134 may include a silicon nitride layer, quantum dots, or nanocrystals. The quantum dots or the nanocrystals may include a conductor, for example, fine particles of a metal or a semiconductor. The tunneling insulation layer 132 and the blocking insulation layer 136 may include an oxide film, a nitride film, or a high-dielectric-constant film. The high-dielectric-constant film may be a dielectric film having a dielectric constant higher than that of an oxide film and a nitride film.

The string select transistor SST may include a string select gate electrode 155 on the sidewall of the semiconductor pillar 120a or 120b. The string select transistor SST may be connected to the bit line 180. The bit line 180 may be formed to have a line-shaped pattern extending along the first direction (x direction). The ground select transistor GST may include a ground select gate electrode 150 on the sidewall of the semiconductor pillar 120a or 120b.

The storage medium 130 between the string select transistor SST and the semiconductor pillar 120a or 120b, and the storage medium 130 between the ground select transistor GST and the semiconductor pillar 120a or 120b may function as gate insulation layers, and therefore, may be replaced with a single insulation layer. Interlayer insulation layers 140 may be disposed among the ground select gate electrode 150, the control gate electrodes 160, and the string select gate electrodes 155. The storage mediums 130 may be formed to extend along the surfaces of the interlayer insulation layers 140.

The first and second cell strings CST1 and CST2 may be disposed adjacent to each other, with the semiconductor pillar 120a being interposed therebetween. The third and fourth cell strings CST3 and CST4 may be disposed adjacent to each other, with the semiconductor pillar 120b being interposed therebetween. On the other hand, an insulation layer 170 may be disposed between the second cell string CST2 and the third cell string CST3.

The string select gate electrode 155 may be connected to the string select line SSL through a contact plug 185. The control gate electrodes 160 may be connected to the corresponding word lines WL1 to WLn through contact plugs 190. The ground select gate electrode 150 may be connected to the ground select line GSL through a contact plug 195.

Figure 7:
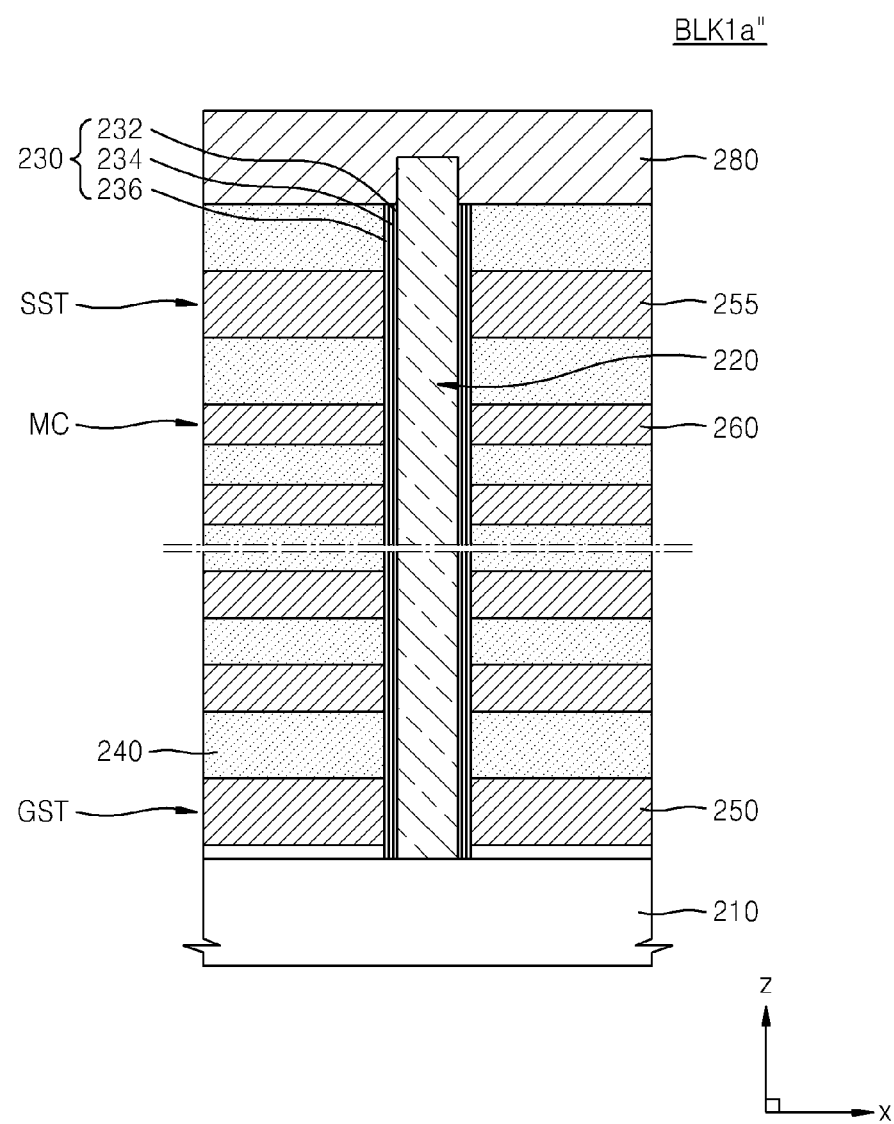
FIG. 7 is a cross-sectional view illustrating another example of the first memory block of FIG. 4, taken along a bit line direction.

FIG. 7 is a cross-sectional view illustrating another example BLK1a" of the first memory block of FIG. 4, taken along a bit line direction.

Referring to FIG. 7, the first memory block BLK1a" may include a substrate 210 having a main surface extending in a first direction (x direction). The substrate 210 may include a semiconductor material, for example, a group IV semiconductor, a group III-V compound semiconductor, or a group II-VI oxide semiconductor. Examples of the group IV semiconductor may include silicon, germanium, and silicon-germanium. In this case, the substrate 210 may include a bulk wafer or an epitaxial layer.

A semiconductor pillar 220 may be arranged on the substrate 210 to vertically extend from the substrate 210. The semiconductor pillar 220 may include a semiconductor material, such as polysilicon or single crystal silicon. The semiconductor material may include undoped impurities, p-type impurities, or n-type impurities.

The storage medium 230 may be formed to extend along a length direction of the semiconductor pillar 220. The storage medium 230 may include a tunneling insulation layer 232 on a sidewall of the semiconductor pillar 220, a charge storage layer 234 on the tunneling insulation layer 232, and a blocking insulation layer 236 on the charge storage layer 234.

A string select transistor SST may include a string select gate electrode 255 on the sidewall of the semiconductor pillar 220. The string select transistor SST may be connected to a bit line 280. The bit line 280 may be formed to have a line-shaped pattern extending along the first direction (x direction). A ground select transistor GST may include a ground select gate electrode 250 on the sidewall of the semiconductor pillar 220.

The storage medium 230 between the string select transistor SST and the semiconductor pillar 220, and the storage medium 230 between the ground select transistor GST and the semiconductor pillar 220 may function as gate insulation layers, and therefore, may be replaced with a single insulation layer. Interlayer insulation layers 240 may be disposed among the ground select gate electrode 250, the control gate electrodes 260, and the string select gate electrodes 255.

Figure 8:
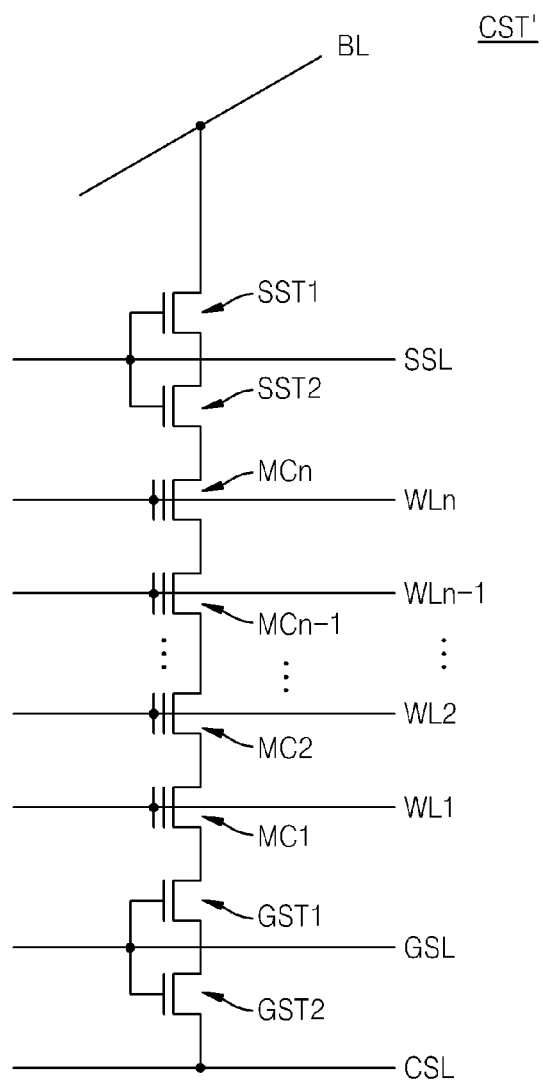
FIG. 8 is a circuit diagram illustrating an example of a cell string included in the memory block of FIG. 4.

FIG. 8 is a circuit diagram illustrating another example CST' of the cell string included in the memory block of FIG. 4.

Referring to FIG. 8, the cell string CST' may include at least one pair of string select transistors SST1 and SST2, a plurality of memory cells MC1 to MCn, and at least one pair of ground select transistors GST1 and GST2. A bit line BL may be connected to one end of the cell string CST', and a common source line CSL may be connected to the other end of the cell string CST'.

Some elements included in the cell string CST' according to the present embodiment are substantially the same as the elements included in the cell string CST of FIG. 4. Similar reference numerals denote similar elements in FIGS. 4 and 8, and descriptions of the same elements as those of the cell string CST of FIG. 4 will not be repeated. The following description will focus on a difference between the cell string CST of FIG. 4 and the cell string CST' of the present embodiment.

The plurality of memory cells MC1 to MCn may be vertically arranged in series. The memory cells MC1 to MCn may store data. A plurality of word lines WL1 to WLn may be connected to the memory cells MC1 to MCn in order to control the memory cells MC1 to MCn. The number of the memory cells MC1 to MCn may be appropriately selected according to a capacity of the non-volatile memory device.

At least one pair of string select transistors SST1 and SST2 may be arranged adjacent to each other at one side of the memory cells MC1 to MCn. For example, the string select transistors SST1 and SST2 may be disposed between the bit line BL and the n-th memory cell MCn, and may be connected in series to the n-th memory cell MCn. The string select transistors SST1 and SST2 may control signal transfer between the bit line BL and the memory cells MC1 to MCn. A string select line SSL may be commonly connected to the string select transistors SST1 and SST2. Therefore, the string select transistors SST1 and SST2 may interwork with each other to operate as a single transistor.

At least one pair of ground select transistors GST1 and GST2 may be arranged adjacent to each other at a side opposite to the string select transistors SST1 and SST2, that is, the other side of the memory cells MC1 to MCn. For example, the ground select transistors GST1 and GST2 may be disposed between the common source line CSL and the first memory cell MC1, and may be connected in series to the first memory cell MC1. The ground select transistors GST1 and GST2 may control signal transfer between the common source line CSL and the memory cells MC1 to MCn. A ground select line GSL may be commonly connected to the ground select transistors GST1 and GST2. Therefore, the ground select transistors GST1 and GST2 may interwork with each other to operate as a single transistor.

According to the present embodiment, by providing at least two string select transistors SST1 and SST2, the length of each of the string select gate electrodes (155 of FIG. 5) may be significantly decreased as compared with the case of the single string select transistor. Therefore, a gap between the interlayer insulation layers (140 of FIG. 5) may be filled without voids. Furthermore, by providing at least two ground select transistors GST1 and GST2, the length of each of the ground select gate electrodes (150 of FIG. 5) may be significantly decreased as compared with the case of the single string select transistor. Therefore, a gap between the interlayer insulation layers (140 of FIG. 5) may be filled without voids.

Figure 9:
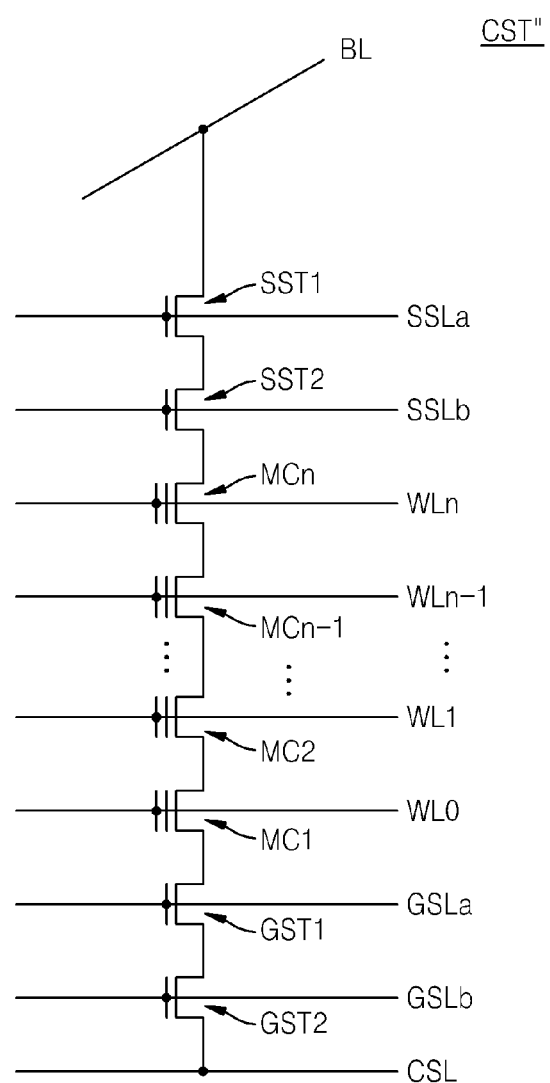
FIG. 9 is a circuit diagram illustrating another example of the cell string included in the memory block of FIG. 4.

FIG. 9 is a circuit diagram illustrating another example CST" of the cell string included in the memory block of FIG. 4.

Referring to FIG. 9, the cell string CST" may include at least one pair of string select transistors SST1 and SST2, a plurality of memory cells MC1 to MCn, and at least one pair of ground select transistors GST1 and GST2. A bit line BL may be connected to one end of the cell string CST", and a common source line CSL may be connected to the other end of the cell string CST".

Some elements included in the cell string CST" according to the present embodiment are substantially the same as the elements included in the cell string CST' of FIG. 8. Similar reference numerals denote similar elements in FIGS. 8 and 9, and descriptions of the same elements as those of the cell string CST' of FIG. 8 will not be repeated. The following description will focus on a difference between the cell string CST' of FIG. 8 and the cell string CST" of the present embodiment.

At least one pair of string select transistors SST1 and SST2 may be arranged adjacent to each other at one side of the memory cells MC1 to MCn. For example, the string select transistors SST1 and SST2 may be disposed between the bit line BL and the n-th memory cell MCn, and may be connected in series to the n-th memory cell MCn. The string select transistors SST1 and SST2 may control signal transfer between the bit line BL and the memory cells MC1 to MCn. A first string select line SSLa may be connected to the first string select transistor SST1, and a second string select line SSLb may be connected to the second string select transistor SST2.

At least one pair of ground select transistors GST1 and GST2 may be arranged adjacent to each other at a side opposite to the string select transistors SST1 and SST2, that is, the other side of the memory cells MC1 to MCn. For example, the ground select transistors GST1 and GST2 may be disposed between the common source line CSL and the first memory cell MC1, and may be connected in series to the first memory cell MC1. The ground select transistors GST1 and GST2 may control signal transfer between the common source line CSL and the memory cells MC1 to MCn. A first ground select line GSLa may be connected to the first ground select transistor GST1, and the second ground select line GSLb may be connected to the second ground select transistor GST2.

Figure 10:
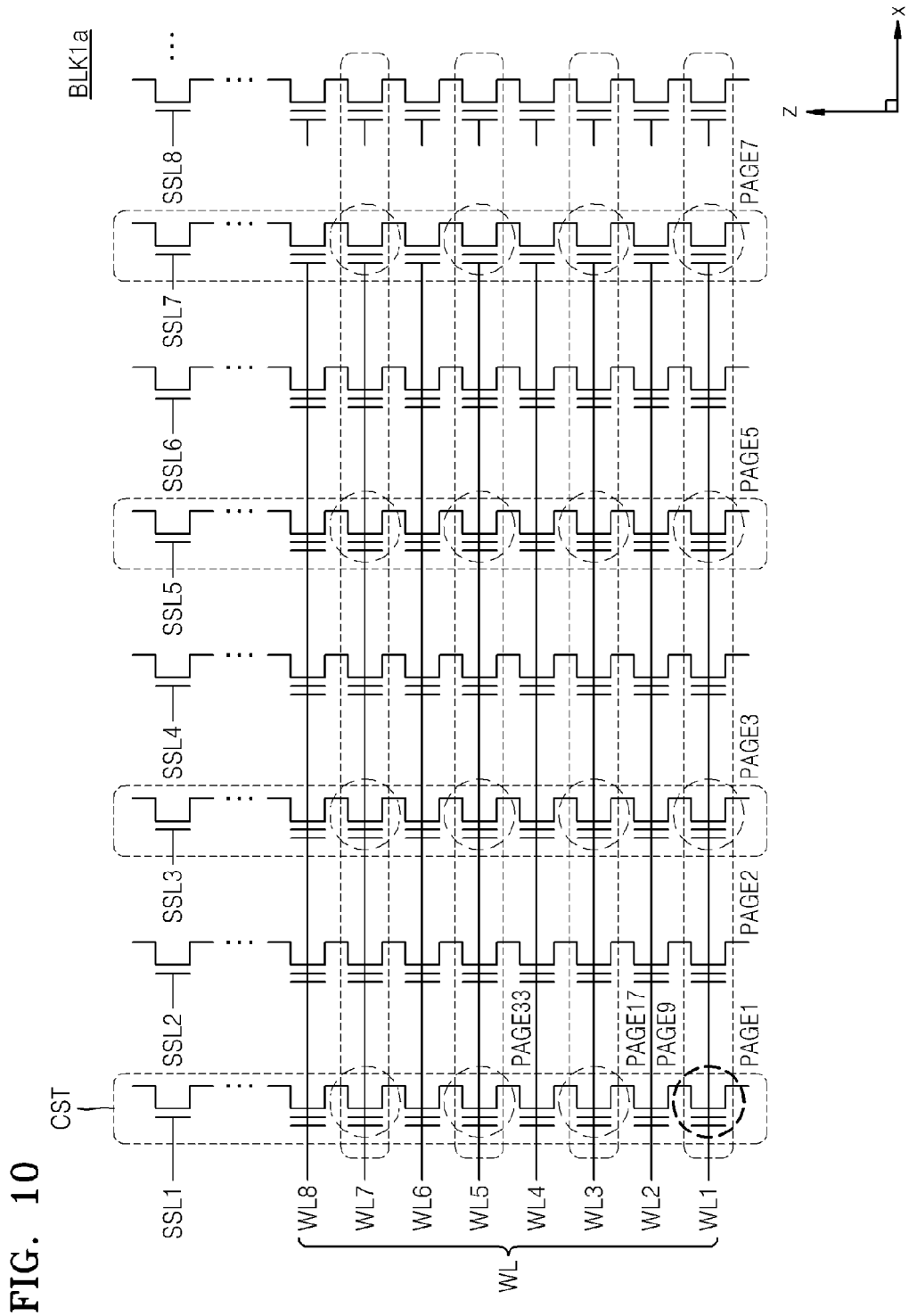
FIG. 10 is a circuit diagram of the memory block of FIG. 4 when viewed in a first direction.

FIG. 10 is a circuit diagram of the memory block of FIG. 4 when viewed in the first direction.

Referring to FIG. 10, memory cells MC adjacent in the first direction (x direction) may be connected to the same word line WL. Memory cells MC adjacent in the second direction (y direction) may constitute a single page PAGE. Memory cells MC adjacent in the third direction (z direction) may be connected to the same string select line (one of SSL1 to SSL8) to constitute a single cell string CST.

Figure 11:
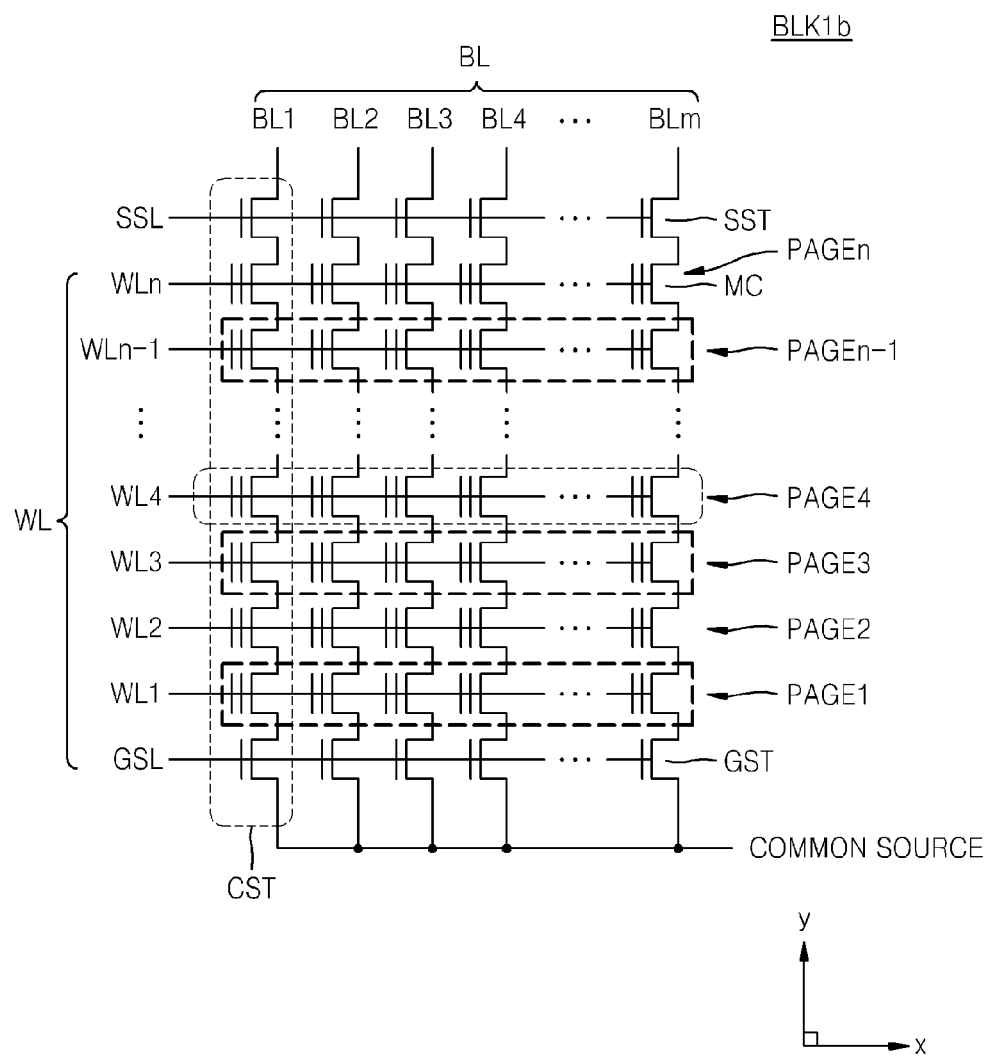
FIG. 11 is a circuit diagram illustrating another example of the first memory block included in the memory cell array of FIG. 3.

FIG. 11 is a circuit diagram illustrating another example BLK1*b* of the first memory block included in the memory cell array of FIG. 3.

Referring to FIG. 11, the first memory block BLK1*b* may be a horizontal NAND flash memory. Each of the memory blocks BLK1 to BLKa illustrated in FIG. 3 may be implemented as illustrated in FIG. 11. In FIG. 11, it is assumed that a first direction and a second direction are indicated as an x direction and a y direction, respectively. However, the inventive concept is not limited thereto. The first and second directions may be changed.

The first memory block BLK1*b* may include a plurality of cell strings CST, a plurality of word lines WL, a plurality of bit lines BL, a ground select line GSL, a string select line SSL, and a common source line CSL. The number of the cell strings CST, the number of the word lines WL, and the number of the bit lines BL may be variously changed according to embodiments.

The cell string CST may include a string select transistor SST, a plurality of memory cells MC, and a ground select transistor GST, which are connected in series between the bit line BL and the common source line CSL. However, the inventive concept is not limited thereto. In another embodiment, the cell string CST may further include at least one dummy cell.

The NAND flash memory device having the structure of FIG. 11 may perform an erase operation in block units and a program operation in page units corresponding to the respective word lines WL1 to WLn.

FIG. 12 is a diagram illustrating an example of a program operation of the memory block BLK1a of FIG. 10 or the memory block BLK1b of FIG. 11.

Referring to FIGS. 10 and 12, a program operation and a program verify operation may constitute a single program loop. When the program has been completed, that is, when the result of the program verify operation is "program pass", the program operation is ended. Therefore, the number (N) of the program loops for each page may be determined according to the result of the program verify operation. The number (N) of the program loops for each page may be equal to or greater than 1.

For example, the program loops may be executed four times on the first page PAGE1, and the program loops may be executed four times on the second page PAGE2. That is, the program operations and the program verify operations may be performed four times on the first page PAGE1, and the program operations and the program verify operations may be performed four times on the second page PAGE2. Therefore, a total of eight program loops may be executed so as to perform the program operations on the first and second pages PAGE1 and PAGE2.

Figure 13:
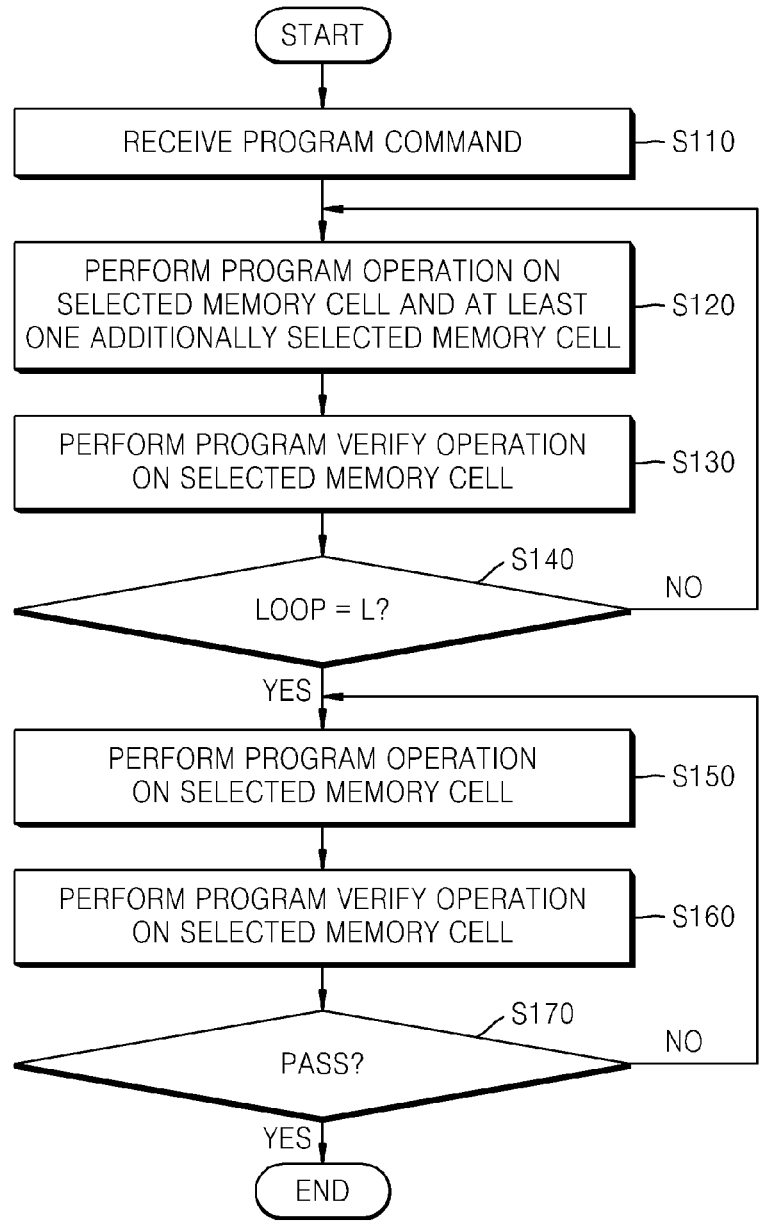
FIG. 13 is a flowchart of a method of programming a memory system according to an embodiment of the inventive concept.

FIG. 13 is a flowchart illustrating a method of programming a memory system according to an embodiment of the inventive concept.

Referring to FIG. 13, a method of programming a memory system according to the present embodiment is a method of controlling a program voltage for writing data to a memory cell array included in a memory device. The contents described with reference to FIGS. 1 to 12 may also be applied to a method of programming the memory device according to the present embodiment. Hereinafter, the method of programming the memory system according to the present embodiment will be described in detail with reference to FIGS. 10 and 13. However, the inventive concept is not limited thereto. The method of FIG. 13 may also be applied to the memory device including the memory block BLK1b of FIG. 11.

The method of programming the memory system according to the present embodiment may repetitively execute N program loops. Each of the N program loops may include a program operation and a program verify operation. Herein, N is a natural number equal to or greater than 2.

In operation S110, a program command CMD is received. For example, the memory device 10 may receive the program command CMD from the memory controller 20. In addition, the memory device 10 may receive an address ADDR of a selected memory cell and an address ADDR of at least one additionally selected memory cell from the memory controller 20.

In operation S120, a program operation is performed on the selected memory cell and at least one additionally selected memory cell. Specifically, the program operation may be performed on the selected memory cell and at least one additionally selected memory cell by applying a program voltage to at least one word line to which the selected memory cell and at least one additionally selected memory cell are connected. Therefore, it is possible to decrease a program time for the entire memory cell array including the selected memory cell and at least one additionally selected memory cell.

More specifically, the selected memory cell may be a memory cell included in a selected page, and at least one additionally selected memory cell may be a memory cell included in at least one additionally selected page. Since the program operation on the selected memory cell may be performed in page units, the program operation on the selected memory cell may be regarded as a program operation on the page including the selected memory cell.

In some embodiments, the selected memory cell and at least one additionally selected memory cell may be connected to different word lines. Specifically, the different word lines may not be disposed adjacent to each other. In some embodiments, the different word lines may be alternately disposed. However, the inventive concept is not limited thereto. In other embodiments, the different word lines to which the selected memory cell and at least one additionally selected memory cell are connected may be disposed adjacent to each other.

For example, the selected memory cell may be connected to the first word line WL1, and the additionally selected memory cell may be connected to the third word line WL3. The first word line WL1 and the third word line WL3 may not be disposed adjacent to each other. At this time, the selected memory cell may be a memory cell included in the first page PAGE1 of FIG. 10. In addition, at least one additionally selected memory cell may be a memory cell included in the seventeenth page PAGE17 of FIG. 10.

In another example, a selected memory cell may be connected to the first word line WL1, and a plurality of additionally selected memory cells may be connected to the third word line WL3, the fifth word line WL5 and the seventh word line WL7, respectively. The number of the additionally selected memory cells may be variously changed according to embodiments.

In some embodiments, the selected memory cell and at least one additionally selected memory cell may be commonly connected to a selected word line. In this case, the selected memory cell and at least one additionally selected memory cell may be connected to different string select lines. In some embodiments, the different string select lines may be alternately disposed.

For example, the selected memory cell and the plurality of additionally selected memory cells may be commonly connected to the first word line WL1. The selected memory cell may be connected to the first string select line SSL1, and the plurality of additionally selected memory cells may be connected to the third string select line SSL3, the fifth string select line SSL5 and the seventh string select line SSL7, respectively. The number of the additionally selected memory cells may be variously changed according to embodiments.

In some embodiments, the selected memory cell and some of the plurality of additionally selected memory cells may be commonly connected to the selected word line, and the others of the plurality of additionally selected memory cells may be connected to other word line. In this case, the selected memory cell and some of the plurality of additionally selected memory cells may be connected to different string select lines. In some embodiments, different word lines may be alternately disposed, and different string select lines may be alternately disposed.

For example, the selected memory cell and some of the plurality of additionally selected memory cells may be commonly connected to the first word line WL1, and the others of the plurality of additionally selected memory cells may be connected to the third word line WL3. In addition, the selected memory cell may be connected to the first string select line SSL1, and some of the plurality of additionally selected memory cells may be connected to the third string select line SSL3, the fifth string select line SSL5 and the seventh string select line SSL7, respectively. The number of the additionally selected memory cells may be variously changed according to embodiments.

In operation S130, a program verify operation is performed on the selected memory cell. Specifically, the program verify operation may be performed on the selected memory cell by applying a program verify voltage to the selected word line to which the selected memory cell is connected. As described above, according to the present embodiment, while the program operation is simultaneously performed on the selected memory cell and the additional selected memory cell, the program verify operation is performed on only the selected memory cell. Therefore, in case that the program operation on the selected memory cell has been completed and the program operation on the additionally selected memory cell has not been completed, it is possible to prevent the selected memory cell from being overprogrammed by the program operation that is performed again according to the verification result of the additionally selected memory cell.

In operation S140, it is determined whether the number of the program loops is L. Herein, L is a natural number equal to or greater than 1. Operation S150 is performed when it is determined that the number of the program loops is L. On the other hand, operations S120 and S130 are repeated when it is determined that the number of the program loops is not L. As described above, according to the present embodiment, the program operation may be simultaneously performed on the selected memory cell and the additionally selected memory cell with respect to only the L program loops among the total N program loops.

In operation S150, the program operation is performed on the selected memory cell. Specifically, the program operation is performed on the selected memory cell by applying the program voltage to the selected word line to which the selected memory cell is connected.

In operation S160, the program verify operation is performed on the selected memory cell. Specifically, the program verify operation may be performed on the selected memory cell by applying the program verify voltage to the selected word line to which the selected memory cell is connected.

In operation S170, it is determined whether the program has been completed, that is, whether the result of the program verify operation is "program pass". When the result of the program verify operation is "program pass", the program operation is ended. On the other hand, operations S150 and S160 are repeated when the result of the program verify operation is not "program pass". As described above, according to the present embodiment, the program operation and the program verify operation may be performed on only the selected memory cell in the (N−L) program loops among the N program loops for the selected memory cell.

Figure 14:
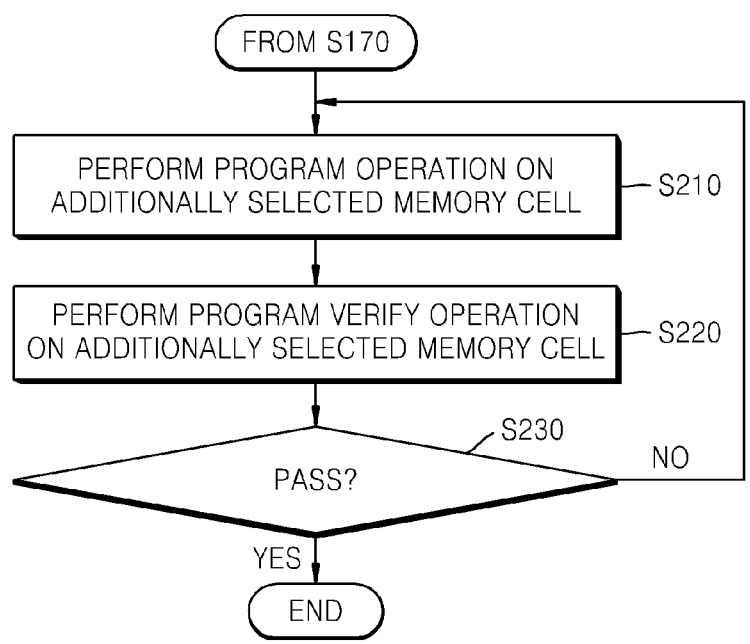
FIG. 14 is a flowchart of a method of programming a memory system according to an embodiment of the inventive concept.

FIG. 14 is a flowchart of a method of programming a memory system according to an embodiment of the inventive concept.

Referring to FIG. 14, a method of programming a memory system according to the present embodiment is a method of programming at least one additionally selected memory cell, including operations subsequent to operation S170 of FIG. 13.

In operation S210, a program operation is performed on an additionally selected memory cell. Specifically, the program operation is performed on the additionally selected memory cell by applying a program voltage to an additionally selected word line to which the additionally selected memory cell is connected.

In operation S220, a program verify operation is performed on the additionally selected memory cell. Specifically, the program verify operation may be performed on the additionally selected memory cell by applying a program verify voltage to the additionally selected word line to which the additionally selected memory cell is connected.

In operation S230, it is determined whether the program has been completed, that is, the result of the program verify operation is "program pass". Herein, M is a natural number equal to or greater than 1, and corresponds to N−L. When the result of the program verify operation is "program pass", the program operation is ended. On the other hand, operations S210 and S220 are repeated when the result of the program verify operation is not "program pass". As described above, according to the present embodiment, when the selected memory cell passes in the N-th program loop and the additionally selected memory cell passes in the M-th program loop, the total number of the program loops is not (N+M) but (M+N−L). Therefore, a total program time may be decreased.

Figure 15:
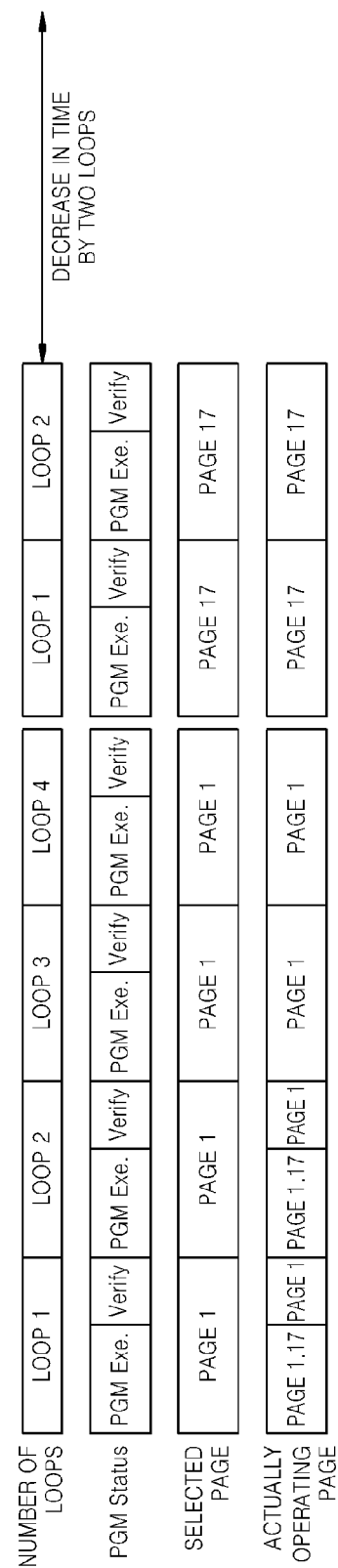
FIG. 15 is a diagram illustrating an example of a multi-program operation of the memory device of FIG. 10 according to the programming methods of FIGS. 13 and 14.

FIG. 15 is a diagram illustrating an example of a multi-program operation of the memory device of FIG. 10 according to the programming methods of FIGS. 13 and 14. FIG. 16 is a diagram illustrating whether a program operation is performed for each page of FIG. 10, according to the multi-program operation of FIG. 15. FIG. 17 is a diagram illustrating voltage conditions of the word lines and the string select lines of FIG. 10, according to the multi-program operation of FIG. 15.

Referring to FIGS. 15 to 17, in the present embodiment, the selected page may be the first page PAGE1, and the additionally selected page may be the seventeenth page PAGE17. Therefore, the selected memory cell may be memory cells included in the first page PAGE1, and the additionally selected memory cell may be memory cells included in the seventeenth page PAGE17. In addition, N, L, and M may be 4, 2, and 2, respectively. Hereinafter, the program operation for each page including the memory cells will be described.

Specifically, a page selected in the first program operation, that is, first to fourth program loops LOOP1 to LOOP4, may be the first page PAGE1, and a page selected in the second program operation, that is, the first and second program loops LOOP1 and LOOP2, may be the seventeenth page PAGE17. Since the program operation may be simultaneously performed on the first and seventeenth pages PAGE1 and PAGE17 in the first and second program loops LOOP1 and LOOP2 among the first to fourth program loops LOOP1 to LOOP4, the program operation according to the present embodiment may be regarded as a multi-program operation.

First, the first program operation, in which the selected page is the first page PAGE1, will be described below in detail. The first page PAGE1 may be connected to the first word line WL1 and the first string select line SSL1. The second page PAGE2 is an unselected page. The second page PAGE2 may be adjacent to the first page PAGE1 in the first direction (x direction), and may be connected to the first word line WL1 and the second string select line SSL2. The ninth page PAGE9 is an unselected page. The ninth page PAGE9 may be adjacent to the first page PAGE1 in the third direction (z direction), and may be connected to the second word line WL2 and the first string select line SSL1. The seventeenth page PAGE17 is an additionally selected page. The seventeenth page PAGE17 may be alternately disposed with respect to the first page PAGE1 in the third direction (z direction), and may be connected to the third word line WL3 and the first string select line SSL1.

In the first and second program loops LOOP1 and LOOP2, the program operation may be simultaneously performed on the selected first page PAGE1 and the additionally selected seventeenth page PAGE17. Specifically, a first program voltage Vpgm1 may be applied to the first and third word lines WL1 and WL3 in the first program loop LOOP1, and a second program voltage Vpgm2 may be applied to the first and third word lines WL1 and WL3 in the second program loop LOOP2. A pass voltage Vpass may be applied to the second word line WL2. At this time, the second program voltage Vpgm2 may have a voltage level higher than that of the first program voltage Vpgm1 by a step voltage. In addition, an on-voltage Von may be applied to the first string select line SSL1, and an off-voltage Voff may be applied to the second string select line SSL2.

Furthermore, in the first and second program loops LOOP1 and LOOP2, a program verify operation may be performed on only the selected first page PAGE1. Specifically, a program verify voltage Vver may be applied to the first word line WL1, and a read voltage Vread may be applied to the second and third word lines WL2 and WL3. In addition, the on-voltage Von may be applied to the first string select line SSL1, and the off-voltage Voff may be applied to the second string select line SSL2.

In the third and fourth program loops LOOP3 and LOOP4, the program operation may be performed on only the selected first page PAGE1. Specifically, a third program voltage Vpgm3 may be applied to the first word line WL1 in the third program loop LOOP3, and a fourth program voltage Vpgm4 may be applied to the first word line WL1 in the fourth program loop LOOP4. The pass voltage Vpass may be applied to the second and third word lines WL2 and WL3. At this time, the third program voltage Vpgm3 may have a voltage level higher than that of the second program voltage Vpgm2 by the step voltage. In addition, the on-voltage Von may be applied to the first string select line SSL1, and the off-voltage Voff may be applied to the second string select line SSL2.

Furthermore, in the third and fourth program loops LOOP3 and LOOP4, the program verify operation may be performed on only the selected first page PAGE1. Specifically, the program verify voltage Vver may be applied to the first word line WL1, and the read voltage Vread may be applied to the second and third word lines WL2 and WL3. In addition, the on-voltage Von may be applied to the first string select line SSL1, and the off-voltage Voff may be applied to the second string select line SSL2.

Next, the second program operation, in which the selected page is the seventeenth page PAGE17, will be described below in detail.

In the first and second program loops LOOP1 and LOOP2, the program operation may be performed on only the selected seventeenth page PAGE17. Specifically, the third program voltage Vpgm3 may be applied to the third word line WL3 in the first program loop LOOP1, and the fourth program voltage Vpgm4 may be applied to the third word line WL3 in the second program loop LOOP2. The pass voltage Vpass may be applied to the first and second word lines WL1 and WL2. Specifically, the third program voltage Vpgm3 may have a voltage level higher than that of the second program voltage Vpgm2 by the step voltage, and the fourth program voltage Vpgm4 may have a voltage level higher than that of the third program voltage Vpgm3 by the step voltage. The seventeenth page PAGE17 is in a state of being programmed with the first and second program voltages Vpgm1 and Vpgm2 in the first and second program loops LOOP1 and LOOP2. Therefore, the seventeenth page PAGE17 may be programmed using the third program voltage Vpgm3. In addition, the on-voltage Von may be applied to the first string select line SSL1, and the off-voltage Voff may be applied to the second string select line SSL2.

Furthermore, in the first and second program loops LOOP1 and LOOP2, the program verify operation may be performed on only the selected seventeenth page PAGE17. Specifically, the program verify voltage Vver may be applied to the third word line WL3, and the read voltage Vread may be applied to the first and second word lines WL1 and WL2. In addition, the on-voltage Von may be applied to the first string select line SSL1, and the off-voltage Voff may be applied to the second string select line SSL2.

Figure 18:
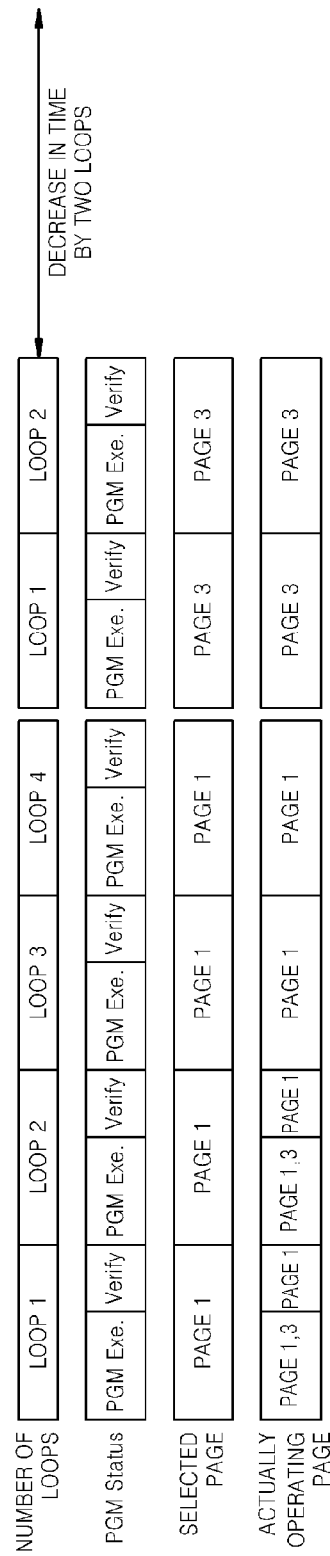
FIG. 18 is a diagram illustrating another example of the multi-program operation of the memory device of FIG. 10 according to the programming methods of FIGS. 13 and 14.

FIG. 18 is a diagram illustrating another example of the multi-program operation of the memory device of FIG. 10 according to the programming methods of FIGS. 13 and 14. FIG. 19 is a diagram illustrating whether a program operation is performed for each page of FIG. 10, according to the multi-program operation of FIG. 18. FIG. 20 is a diagram illustrating voltage conditions of the word lines and the string select lines of FIG. 10, according to the multi-program operation of FIG. 18.

Referring to FIGS. 18 to 20, in the present embodiment, a selected page may be a first page PAGE1, and an additionally selected page may be a third page PAGE3. Therefore, a selected memory cell may be memory cells included in the first page PAGE1, and an additionally selected memory cell may be memory cells included in the third page PAGE3. In addition, N, L, and M may be 4, 2, and 2, respectively. Hereinafter, a program operation for each page including the memory cells will be described.

Specifically, a page selected in a first program operation, that is, first to fourth program loops LOOP1 to LOOP4, may be the first page PAGE1, and a page selected in a second program operation, that is, the first and second program loops LOOP1 and LOOP2, may be the third page PAGE3. Since the program operation may be simultaneously performed on the first and third pages PAGE1 and PAGE3 in the first and second program loops LOOP1 and LOOP2 among the first to fourth program loops LOOP1 to LOOP4, the program operation according to the present embodiment may be regarded as a multi-program operation.

First, the first program operation, in which the selected page is the first page PAGE1, will be described below in detail. The first page PAGE1 may be connected to the first word line WL1 and the first string select line SSL1. The second page PAGE2 is an unselected page. The second page PAGE2 may be adjacent to the first page PAGE1 in the first direction (x direction), and may be connected to the first word line WL1 and the second string select line SSL2. The third page PAGE3 is an additionally selected page. The third page PAGE3 may be alternately disposed with respect to the first page PAGE1 in the first direction (x direction), and may be connected to the first word line WL1 and the third string select line SSL3. The ninth page PAGE9 is an unselected page. The ninth page PAGE9 may be adjacent to the first page PAGE1 in the third direction (z direction), and may be connected to the second word line WL2 and the first string select line SSL1.

In the first and second program loops LOOP1 and LOOP2, the program operation may be simultaneously performed on the selected first page PAGE1 and the additionally selected third page PAGE3. Specifically, a first program voltage Vpgm1 may be applied to the first word line WL1 in the first program loop LOOP1, and a second program voltage Vpgm2 may be applied to the first word line WL1 in the second program loop LOOP2. At this time, the second program voltage Vpgm2 may have a voltage level higher than that of the first program voltage Vpgm1 by the step voltage. On the other hand, a pass voltage Vpass may be applied to the second word line WL2. In addition, an on-voltage Von may be applied to the first and third string select lines SSL1 and SSL3, and an off-voltage Voff may be applied to the second string select line SSL2.

Furthermore, in the first and second program loops LOOP1 and LOOP2, a program verify operation may be performed on only the selected first page PAGE1. Specifically, a program verify voltage Vver may be applied to the first word line WL1, and a read voltage Vread may be applied to the second word line WL2. In addition, the on-voltage Von may be applied to the first string select line SSL1, and the off-voltage Voff may be applied to the second and third string select lines SSL2 and SSL3.

In the third and fourth program loops LOOP3 and LOOP4, the program operation may be performed on only the selected first page PAGE1. Specifically, a third program voltage Vpgm3 may be applied to the first word line WL1 in the third program loop LOOP3, and a fourth program voltage Vpgm4 may be applied to the first word line WL1 in the fourth program loop LOOP4. At this time, the third program voltage Vpgm3 may have a voltage level higher than that of the second program voltage Vpgm2 by the step voltage, and the fourth program voltage Vpgm4 may have a voltage level higher than that of the third program voltage Vpgm3 by the step voltage. On the other hand, the pass voltage Vpass may be applied to the second word line WL2. In addition, the on-voltage Von may be applied to the first string select line SSL1, and the off-voltage Voff may be applied to the second and third string select lines SSL2 and SSL3.

Furthermore, in the third and fourth program loops LOOP3 and LOOP4, the program verify operation may be performed on only the selected first page PAGE1. Specifically, the program verify voltage Vver may be applied to the first word line WL1, and the read voltage Vread may be applied to the second word line WL2. In addition, the on-voltage Von may be applied to the first string select line SSL1, and the off-voltage Voff may be applied to the second and third string select lines SSL2 and SSL3.

Next, the second program operation, in which the selected page is the third page PAGE3, will be described below in detail.

In the first and second program loops LOOP1 and LOOP2, the program operation may be performed on only the selected third page PAGE3. Specifically, the third program voltage Vpgm3 may be applied to the first word line WL1 in the first program loop LOOP1, and the fourth program voltage Vpgm4 may be applied to the first word line WL1 in the second program loop LOOP2. At this time, the third program voltage Vpgm3 may have a voltage level higher than that of the second program voltage Vpgm2 by the step voltage, and the fourth program voltage Vpgm4 may have a voltage level higher than that of the third program voltage Vpgm3 by the step voltage. On the other hand, the pass voltage Vpass may be applied to the second word line WL2. In addition, the on-voltage Von may be applied to the third string select line SSL3, and the off-voltage Voff may be applied to the first and second string select lines SSL1 and SSL2.

Furthermore, in the first and second program loops LOOP1 and LOOP2, the program verify operation may be performed on only the selected third page PAGE3. Specifically, the program verify voltage Vver may be applied to the first word line WL1, and the read voltage Vread may be applied to the second word line WL2. In addition, the on-voltage Von may be applied to the third string select line SSL3, and the off-voltage Voff may be applied to the first and second string select lines SSL1 and SSL2.

Figure 21:
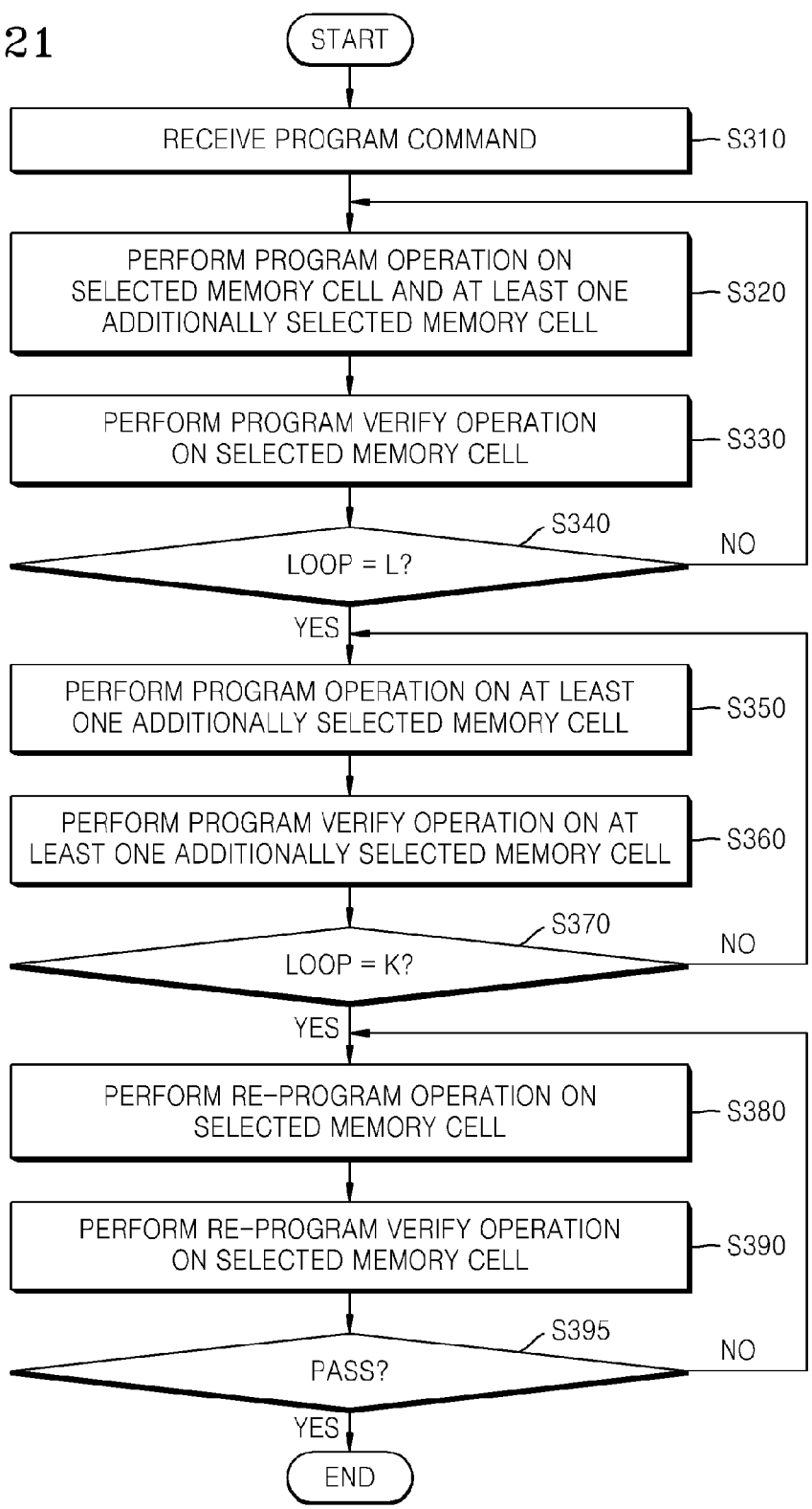
FIG. 21 is a flowchart of a method of programming a memory system according to another embodiment of the inventive concept.

FIG. 21 is a flowchart of a method of programming a memory system according to another embodiment of the inventive concept.

Referring to FIG. 21, the method of programming the memory system according to the present embodiment is a method of controlling a program voltage for writing data to a memory cell array included in a memory device. The contents described with reference to FIGS. 1 to 11 may also be applied to the method of programming the memory system according to the present embodiment. Hereinafter, the method of programming the memory system according to the present embodiment will be described in detail with reference to FIGS. 10 and 20. However, the inventive concept is not limited thereto. The method of FIG. 21 may also be applied to the memory device including the memory block BLK1b of FIG. 11.

The method of programming the memory system according to the present embodiment may repetitively execute N program loops. Each of the N program loops may include a program operation and a program verify operation. Herein, N is a natural number equal to or greater than 2.

In operation S310, a program command CMD is received. For example, the memory device 10 may receive the program command CMD from the memory controller 20. In addition, the memory device 10 may receive an address ADDR of a selected memory cell and an address ADDR of at least one additionally selected memory cell from the memory controller 20.

In operation S320, the program operation is performed on the selected memory cell and at least one additionally selected memory cell. Specifically, the program operation may be performed on the selected memory cell and at least one additionally selected memory cell by applying a program voltage to at least one word line to which the selected memory cell and at least one additionally selected memory cell are connected. Therefore, it is possible to decrease a program time for the entire memory cell array including the selected memory cell and at least one additionally selected memory cell.

More specifically, the selected memory cell may be a memory cell included in a selected page, and at least one additionally selected memory cell may be a memory cell included in at least one additionally selected page. Since the program operation on the selected memory cell may be performed in page unit, the program operation on the selected memory cell may be regarded as a program operation on the page including the selected memory cell.

In some embodiments, the selected memory cell and at least one additionally selected memory cell may be connected to different word lines. Specifically, the different word lines may not be disposed adjacent to each other. In some embodiments, the different word lines may be alternately disposed. However, the inventive concept is not limited thereto. In other embodiments, the different word lines to which the selected memory cell and at least one additionally selected memory cell are connected may be disposed adjacent to each other.

For example, the selected memory cell may be connected to the first word line WL1, and the additionally selected memory cell may be connected to the third word line WL3. The first word line WL1 and the third word line WL3 may not be disposed adjacent to each other. At this time, the selected memory cell may be a memory cell included in the first page PAGE1 of FIG. 10. In addition, at least one additionally selected memory cell may be a memory cell included in the seventeenth page PAGE17 of FIG. 10.

In another example, a selected memory cell may be connected to the first word line WL1, and a plurality of additionally selected memory cells may be connected to the third word line WL3, the fifth word line WL5 and the seventh word line WL7, respectively. The number of the additionally selected memory cells may be variously changed according to embodiments.

In some embodiments, the selected memory cell and at least one additionally selected memory cell may be commonly connected to the selected word line. In this case, the selected memory cell and at least one additionally selected memory cell may be connected to different string select lines. In some embodiments, the different string select lines may be alternately disposed.

For example, the selected memory cell and the plurality of additionally selected memory cells may be commonly connected to the first word line WL1. The selected memory cell may be connected to the first string select line SSL1, and the plurality of additionally selected memory cells may be connected to the third string select line SSL3, the fifth string select line SSL5 and the seventh string select line SSL7, respectively. The number of the additionally selected memory cells may be variously changed according to embodiments.

In some embodiments, the selected memory cell and some of the plurality of additionally selected memory cells may be commonly connected to the selected word line, and the others of the plurality of additionally selected memory cells may be connected to other word line. In this case, the selected memory cell and some of the plurality of additionally selected memory cells may be connected to different string select lines. In some embodiments, different word lines may be alternately disposed, and different string select lines may be alternately disposed.

For example, the selected memory cell and some of the plurality of additionally selected memory cells may be commonly connected to the first word line WL1, and the others of the plurality of additionally selected memory cells may be connected to the third word line WL3. In addition, the selected memory cell may be connected to the first string select line SSL1, and some of the plurality of additionally selected memory cells may be connected to the third string select line SSL3, the fifth string select line SSL5 and the seventh string select line SSL7, respectively. The number of the additionally selected memory cells may be variously changed according to embodiments.

In operation S330, the program verify operation is performed on the selected memory cell. Specifically, the program verify operation may be performed on the selected memory cell by applying a program verify voltage to the selected word line to which the selected memory cell is connected. As described above, according to the present embodiment, while the program operation is simultaneously performed on the selected memory cell and the additional selected memory cell, the program verify operation is performed on only the selected memory cell. Therefore, in case that the program operation on the selected memory cell has been completed and the program operation on the additionally selected memory cell has not been completed, it is possible to prevent the selected memory cell from being overprogrammed by the program operation that is performed again according to the verification result of the additionally selected memory cell.

In operation S340, it is determined whether the number of the program loops is L. Herein, L is a natural number equal to or greater than 1. Operation S350 is performed when it is determined that the number of the program loops is L. On the other hand, operations S320 and S330 are repeated when it is determined that the number of the program loops is not L. As described above, according to the present embodiment, the program operation may be simultaneously performed on the selected memory cell and the additionally selected memory cell with respect to only the L program loops among the total N program loops.

In operation S350, the program operation is performed on at least one additionally selected memory cell. Specifically, the program operation may be performed on at least one additionally selected memory cell by applying the program voltage to at least one additionally selected word line to which at least one additionally selected memory cell is connected.

In operation S360, the program verify operation is performed on at least one additionally selected memory cell. Specifically, the program verify operation may be performed on at least one additionally selected memory cell by applying the program verify voltage to at least one additionally selected word line to which at least one additionally selected memory cell is connected.

In operation S370, it is determined whether the number of the program loops is K. Herein, K is a natural number equal to or greater than 2. Operation S380 is performed when it is determined that the number of the program loops is K. On the other hand, operations S350 and S360 are repeated when it is determined that the number of the program loops is not K. As described above, according to the present embodiment, the program operation and the program verify operation may be performed on the additionally selected memory cell in the (K-L) program loops among the total N program loops.

In operation S380, a re-program operation is performed on the selected memory cell. Specifically, the re-program operation may be performed on the selected memory cell by applying the program voltage to the selected word line to which the selected memory cell is connected.

In operation S390, a re-program verify operation is performed on the selected memory cell. Specifically, the re-program verify operation may be performed on at least selected memory cell by applying the program verify voltage to the selected word line to which the selected memory cell is connected.

In operation S395, it is determined whether the program has been completed, that is, the result of the re-program verify operation is "re-program pass". When the result of the re-program verify operation is "re-program pass", the program operation is ended. On the other hand, operations S380 and S390 are repeated when the result of the re-program verify operation is not "re-program pass".

Figure 22:
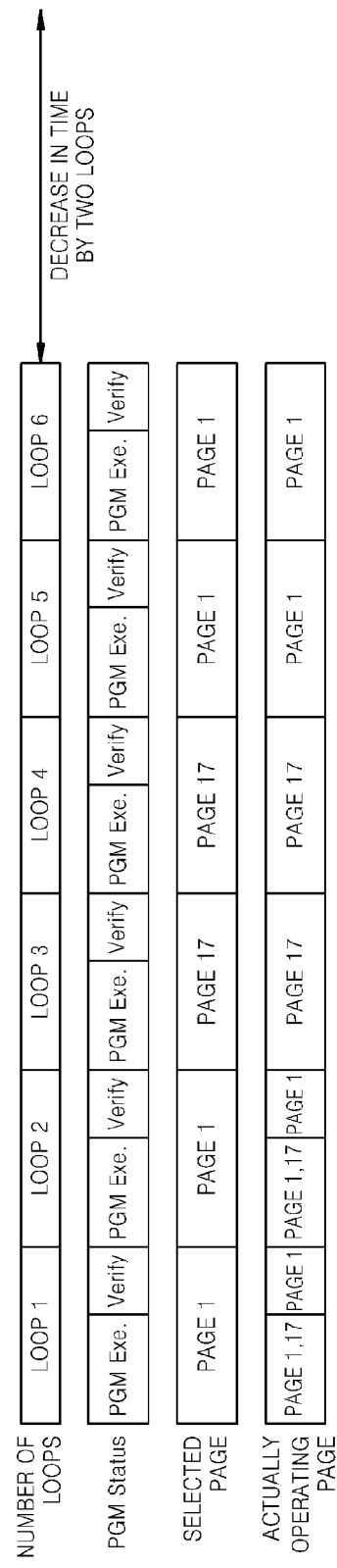
FIG. 22 is a diagram illustrating an example of a multi-program operation of the memory device of FIG. 10 according to the programming method of FIG. 21.

FIG. 22 is a diagram illustrating an example of a multi-program operation of the memory device of FIG. 10 according to the programming method of FIG. 21. FIG. 23 is a diagram illustrating whether a program operation is performed for each page in FIG. 10, according to the multi-program operation of FIG. 22. FIG. 24 is a diagram illustrating voltage conditions of the word lines and the string select lines of FIG. 10, according to the multi-program operation of FIG. 22.

Referring to FIGS. 22 to 24, in the present embodiment, a selected page may be a first page PAGE1, and an additionally selected page may be a seventeenth page PAGE17. Therefore, a selected memory cell may be memory cells included in the first page PAGE1, and at least one additionally selected memory cell may be memory cells included in the seventeenth page PAGE17. In addition, N, L, and K may be 6, 2, and 4, respectively. Hereinafter, the program operation for each page including the memory cells will be described.

A page selected in first and second program loops LOOP1 and LOOP2 may be the first page PAGE1, a page selected in third and fourth program loops LOOP3 and LOOP4 may be the seventeenth page PAGE17, and a page selected in fifth and sixth program loops LOOP5 and LOOP6 may be the first page PAGE1. Since the program operation may be simultaneously performed on the first and seventeenth pages PAGE1 and PAGE17 in the first and second program loops LOOP1 and LOOP2 among the first to sixth program loops LOOP1 to LOOP6, the program operation according to the present embodiment may be regarded as a multi-program operation.

The first page PAGE1 is a page selected in the first, second, fifth and sixth program loops LOOP1, LOOP2, LOOP5 and LOOP6. The first page PAGE1 may be connected to a first word line WL1 and a first string select line SSL1. The second page PAGE2 is an unselected page. The second page PAGE2 may be adjacent to the first page PAGE1 in the first direction (x direction), and may be connected to the first word line WL1 and a second string select line SSL2. The ninth page PAGE9 is an unselected page. The ninth page PAGE9 may be adjacent to the first page PAGE1 in the third direction (z direction), and may be connected to a second word line WL2 and the first string select line SSL1. The seventeenth page PAGE17 is a page additionally selected in the first and second program loops LOOP1 and LOOP2, and is a page selected in the third and fourth program loops LOOP3 and LOOP4. The seventeenth page PAGE17 may be connected to the third word line WL3 and the first string select line SSL1.

In the first and second program loops LOOP1 and LOOP2, the program operation may be simultaneously performed on the selected first page PAGE1 and the additionally selected seventeenth page PAGE17. Specifically, a first program voltage Vpgm1 may be applied to the first and third word lines WL1 and WL3 in the first program loop LOOP1, and a second program voltage Vpgm2 may be applied to the first and third word lines WL1 and WL3 in the second program loop LOOP2. At this time, the second program voltage Vpgm2 may have a voltage level higher than that of the first program voltage Vpgm1 by the step voltage. On the other hand, a pass voltage Vpass may be applied to the second word line WL2. In addition, an on-voltage Von may be applied to the first string select line SSL1, and an off-voltage Voff may be applied to the second string select line SSL2.

Furthermore, in the first and second program loops LOOP1 and LOOP2, a program verify operation may be performed on only the selected first page PAGE1. Specifically, a program verify voltage Vver may be applied to the first word line WL1, and a read voltage Vread may be applied to the second and third word lines WL2 and WL3. In addition, the on-voltage Von may be applied to the first string select line SSL1, and the off-voltage Voff may be applied to the second string select line SSL2.

In the third and fourth program loops LOOP3 and LOOP4, the program operation may be performed on only the selected seventeenth page PAGE17. Specifically, a third program voltage Vpgm3 may be applied to the third word line WL3 in the third program loop LOOP3, and a fourth program voltage Vpgm4 may be applied to the third word line WL3 in the fourth program loop LOOP4. At this time, the third program voltage Vpgm3 may have a voltage level higher than that of the second program voltage Vpgm2 by the step voltage, and the fourth program voltage Vpgm4 may have a voltage level higher than that of the third program voltage Vpgm3 by the step voltage. On the other hand, the pass voltage Vpass may be applied to the second word line WL2. In addition, the on-voltage Von may be applied to the first string select line SSL1, and the off-voltage Voff may be applied to the second string select line SSL2.

Furthermore, in the third and fourth program loops LOOP3 and LOOP4, the program verify operation may be performed on only the selected seventeenth page PAGE17. Specifically, the program verify voltage Vver may be applied to the third word line WL3, and the read voltage Vread may be applied to the first and second word lines WL1 and WL2. In addition, the on-voltage Von may be applied to the first string select line SSL1, and the off-voltage Voff may be applied to the second string select line SSL2.

In the fifth and sixth program loops LOOP5 and LOOP6, the program operation may be performed on only the selected first page PAGE1. Specifically, the third program voltage Vpgm3 may be applied to the first word line WL1 in the fifth program loop LOOP5, and the fourth program voltage Vpgm4 may be applied to the first word line WL1 in the sixth program loop LOOP6. At this time, the third program voltage Vpgm3 may have a voltage level higher than that of the second program voltage Vpgm2 by the step voltage, and the fourth program voltage Vpgm4 may have a voltage level higher than that of the third program voltage Vpgm3 by the step voltage. On the other hand, the pass voltage Vpass may be applied to the second word line WL2. In addition, the on-voltage Von may be applied to the first string select line SSL1, and the off-voltage Voff may be applied to the second string select line SSL2.

Furthermore, in the fifth and sixth program loops LOOP5 and LOOP6, the program verify operation may be performed on only the selected first page PAGE1. Specifically, the program verify voltage Vver may be applied to the first word line WL1, and the read voltage Vread may be applied to the second and third word lines WL2 and WL3. In addition, the on-voltage Von may be applied to the first string select line SSL1, and the off-voltage Voff may be applied to the second string select line SSL2.

Figure 25:
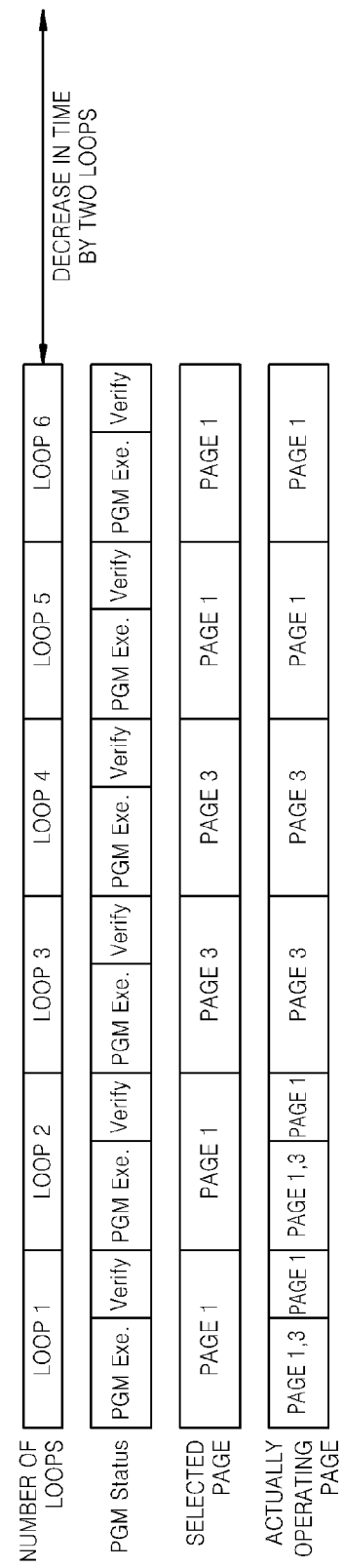
FIG. 25 is a diagram illustrating another example of the multi-program operation of the memory device of FIG. 10 according to the programming method of FIG. 21.

FIG. 25 is a diagram illustrating another example of the multi-program operation of the memory device of FIG. 10 according to the programming method of FIG. 21. FIG. 26 is a diagram illustrating whether a program operation is performed for each page of FIG. 10, according to the multi-program operation of FIG. 25. FIG. 27 is a diagram illustrating voltage conditions of the word lines and the string select lines of FIG. 10, according to the multi-program operation of FIG. 25.

Referring to FIGS. 25 to 27, in the present embodiment, a selected page may be a first page PAGE1, and an additionally selected page may be a third page PAGE3. A selected memory cell may be memory cells included in the first page PAGE1, and at least one additionally selected memory cell may be memory cells included in the third page PAGE3. In addition, N, L, and K may be 6, 2, and 4, respectively. Hereinafter, the program operation for each page including the memory cells will be described.

A page selected in first and second program loops LOOP1 and LOOP2 may be the first page PAGE1, a page selected in third and fourth program loops LOOP3 and LOOP4 may be the third page PAGE3, and a page selected in fifth and sixth program loops LOOP5 and LOOP6 may be the first page PAGE1. Since the program operation may be simultaneously performed on the first and third pages PAGE1 and PAGE3 in the first and second program loops LOOP1 and LOOP2 among the first to sixth program loops LOOP1 to LOOP6, the program operation according to the present embodiment may be regarded as a multi-program operation.

The first page PAGE1 is a page selected in the first, second, fifth and sixth loops LOOP1, LOOP2, LOOP5 and LOOP6. The first page PAGE1 may be connected to a first word line WL1 and a first string select line SSL1. A second page PAGE2 is an unselected page. The second page PAGE2 may be adjacent to the first page PAGE1 in the first direction (x direction) and be connected to the first word line WL1 and a second string select line SSL2. The third page PAGE3 is a page additionally selected in the first and second program loops LOOP1 and LOOP2, and is a page selected in the third and fourth program loops LOOP3 and LOOP4. The third page PAGE3 may be connected to the first word line WL1 and the third string select line SSL3.

In the first and second program loops LOOP1 and LOOP2, the program operation may be simultaneously performed on the selected first page PAGE1 and the additionally selected third page PAGE3. Specifically, a first program voltage Vpgm1 may be applied to the first word line WL1 in the first program loop LOOP1, and a second program voltage Vpgm2 may be applied to the first word line WL1 in the second program loop LOOP2. At this time, the second program voltage Vpgm2 may have a voltage level higher than that of the first program voltage Vpgm1 by the step voltage. On the other hand, a pass voltage Vpass may be applied to the second word line WL2. In addition, an on-voltage Von may be applied to the first and third string select lines SSL1 and SSL3, and an off-voltage Voff may be applied to the second string select line SSL2.

Furthermore, in the first and second program loops LOOP1 and LOOP2, a program verify operation may be performed on only the selected first page PAGE1. Specifically, a program verify voltage Vver may be applied to the first word line WL1, and a read voltage Vread may be applied to the second word line WL2. In addition, the on-voltage Von may be applied to the first string select line SSL1, and the off-voltage Voff may be applied to the second and third string select lines SSL2 and SSL3.

In the third and fourth program loops LOOP3 and LOOP4, the program operation may be performed on only the selected third page PAGE3. Specifically, a third program voltage Vpgm3 may be applied to the first word line WL1 in the third program loop LOOP3, and a fourth program voltage Vpgm4 may be applied to the first word line WL1 in the fourth program loop LOOP4. At this time, the third program voltage Vpgm3 may have a voltage level higher than that of the second program voltage Vpgm2 by the step voltage, and the fourth program voltage Vpgm4 may have a voltage level higher than that of the third program voltage Vpgm3 by the step voltage. On the other hand, the pass voltage Vpass may be applied to the second word line WL2. In addition, the on-voltage Von may be applied to the third string select line SSL3, and the off-voltage Voff may be applied to the first and second string select lines SSL1 and SSL2.

Furthermore, in the third and fourth program loops LOOP3 and LOOP4, the program verify operation may be performed on only the selected third page PAGE3. Specifically, the program verify voltage Vver may be applied to the first word line WL1, and the read voltage Vread may be applied to the second word line WL2. In addition, the on-voltage Von may be applied to the third string select line SSL3, and the off-voltage Voff may be applied to the first and second string select lines SSL1 and SSL2.

In the fifth and sixth program loops LOOP5 and LOOP6, the program operation may be performed on only the selected first page PAGE1. Specifically, the third program voltage Vpgm3 may be applied to the first word line WL1 in the fifth program loop LOOP5, and the fourth program voltage Vpgm4 may be applied to the first word line WL1 in the sixth program loop LOOP6. At this time, the third program voltage Vpgm3 may have a voltage level higher than that of the second program voltage Vpgm2 by the step voltage, and the fourth program voltage Vpgm4 may have a voltage level higher than that of the third program voltage Vpgm3 by the step voltage. On the other hand, the pass voltage Vpass may be applied to the second word line WL2. In addition, the on-voltage Von may be applied to the first string select line SSL1, and the off-voltage Voff may be applied to the second and third string select lines SSL2 and SSL3.

Furthermore, in the fifth and sixth program loops LOOP5 and LOOP6, the program verify operation may be performed on only the selected first page PAGE1. Specifically, the program verify voltage Vver may be applied to the first word line WL1, and the read voltage Vread may be applied to the second word line WL2. In addition, the on-voltage Von may be applied to the first string select line SSL1, and the off-voltage Voff may be applied to the second and third string select lines SSL2 and SSL3.

Figure 28:
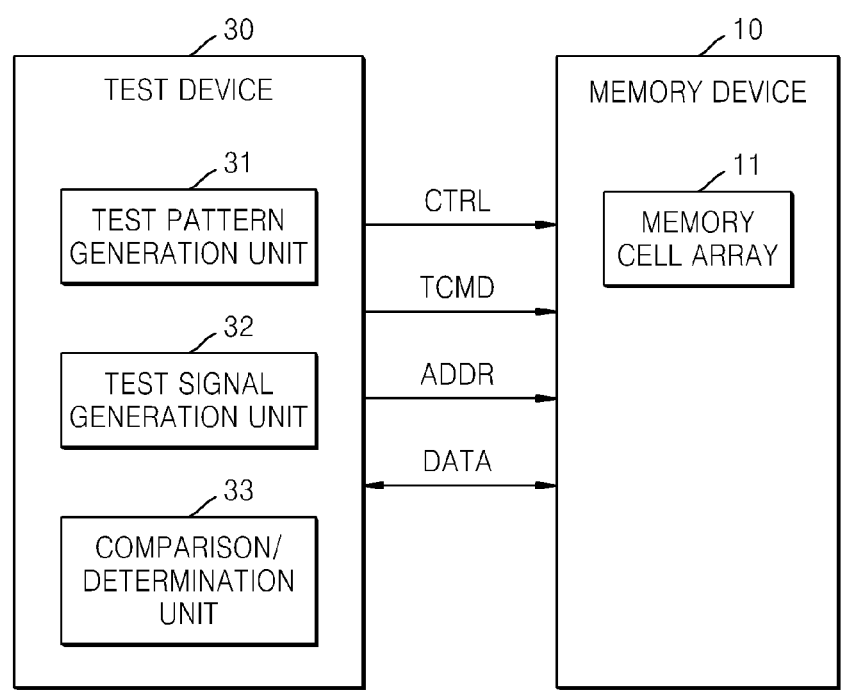
FIG. 28 is a schematic block diagram of a test system according to an embodiment of the inventive concept.

FIG. 28 is a schematic block diagram of a test system 2 according to an embodiment of the inventive concept.

Referring to FIG. 28, the test system 2 may include a memory device 10 and a test device 30. The memory device 10 may include a memory cell array 11, and the test device 30 may include a test pattern generation unit 31, a test signal generation unit 32, and a comparison/determination unit 33. The memory device 10 according to the present embodiment is substantially the same as the memory device 10 of FIG. 1. Therefore, the contents described with reference to FIGS. 1 to 27 may also be applied to the memory device 10 according to the present embodiment. Hereinafter, the elements of the test device 30 will be described in detail.

The test pattern generation unit 31 may generate a test pattern for the memory cell array 11 in response to a request for a test operation, which is input from a host (not illustrated). Specifically, the test pattern generation unit 31 may generate a test pattern in a check board method. Therefore, the test pattern may select alternately arranged word lines and alternately arranged string select lines. At this time, the check board method may also be referred to as a grating method.

The test signal generation unit 32 may generate an address ADDR, data DATA, a test command TCMD, and various control signals CTRL for the memory cell array 11, based on the generated test pattern. The comparison/determination unit 33 may compare the data DATA read from the memory device 10 with reference data, and determine whether to end the test, based on the comparison result.

Figure 29:
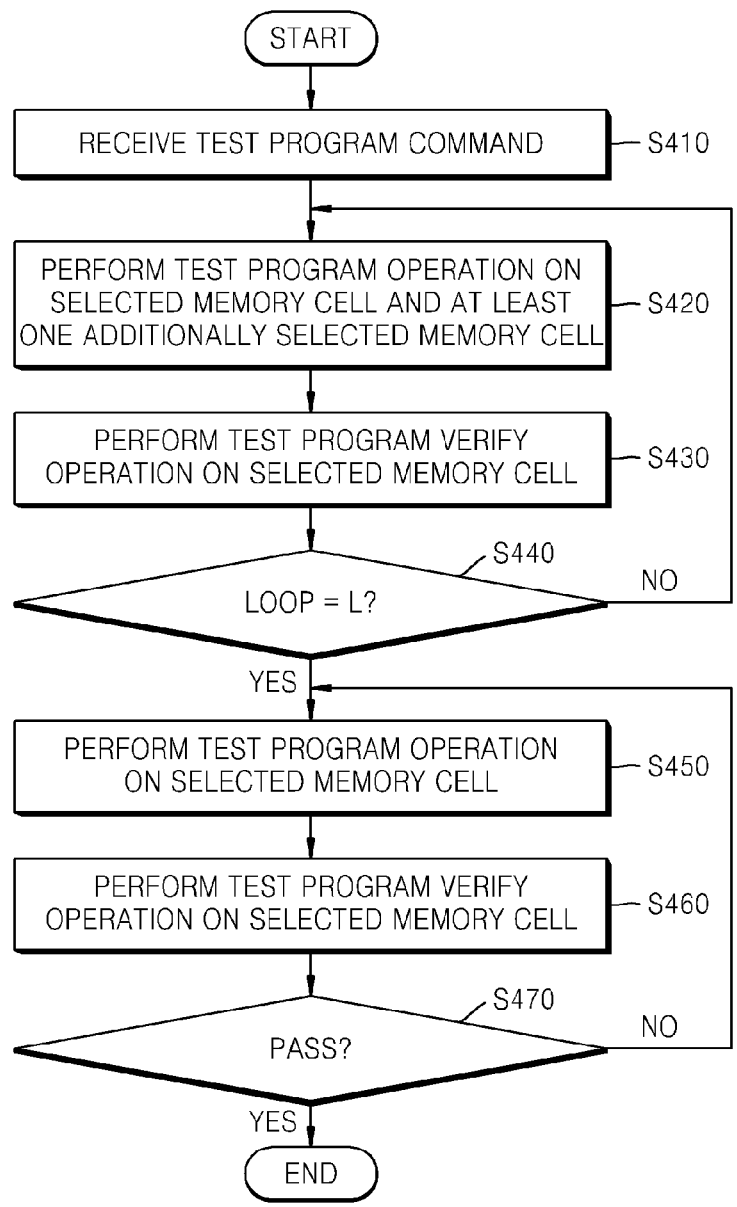
FIG. 29 is a flowchart of a method of testing a memory system according to an embodiment of the inventive concept.

FIG. 29 is a flowchart of a method of testing a memory system according to an embodiment of the inventive concept.

Referring to FIG. 29, a method of testing a memory system according to the present embodiment is a method of controlling a test program voltage for testing whether data has been normally programmed to the memory cell array included in the memory device 10. The contents described with reference to FIGS. 1 to 28 may also be applied to the method of testing the memory system according to the present embodiment. Hereinafter, the method of testing the memory system according to the present embodiment will be described in detail with reference to FIGS. 10 and 29. However, the inventive concept is not limited thereto. The method of FIG. 29 may also be applied to the memory device including the memory block BLK1b of FIG. 11.

The method of testing the memory system according to the present embodiment may repetitively execute N test program loops. Each of the N test program loops may include a test program operation and a test program verify operation. Herein, N is a natural number equal to or greater than 2.

In operation S410, a test program command TCMD is received. For example, the memory device 10 may receive the test program command TCMD from the test device 30.

In operation S420, a test program operation is performed on a selected memory cell and at least one additionally selected memory cell. Specifically, the test program operation may be performed on the selected memory cell and at least one additionally selected memory cell by applying a test program voltage to at least one word line to which the selected memory cell and at least one additionally selected memory cell are connected.

More specifically, the selected memory cell may be a memory cell included in a selected page. In addition, at least one additionally selected memory cell may be a memory cell included in at least one additionally selected page. Since the test program operation on the selected memory cell may be performed in page unit, the test program operation on the selected memory cell may be regarded as a test program operation on the page including the selected memory cell.

In some embodiments, the selected memory cell and at least one additionally selected memory cell may be connected to different word lines. Specifically, the different word lines may not be disposed adjacent to each other. In some embodiments, the different word lines may be alternately disposed. However, the inventive concept is not limited thereto. In other embodiments, the different word lines, to which the selected memory cell and at least one additionally selected memory cell are connected, may be disposed adjacent to each other.

For example, a selected memory cell may be connected to the first word line WL1, and a plurality of additionally selected memory cells may be connected to the third word line WL3, the fifth word line WL5 and the seventh word line WL7, respectively. The number of the additionally selected memory cells may be variously changed according to embodiments.

In some embodiments, the selected memory cell and at least one additionally selected memory cell may be commonly connected to the selected word line. In this case, the selected memory cell and at least one additionally selected memory cell may be connected to different string select lines. In some embodiments, the different string select lines may be alternately disposed.

For example, the selected memory cell and the plurality of additionally selected memory cells may be commonly connected to the first word line WL1. The selected memory cell may be connected to the first string select line SSL1, and the plurality of additionally selected memory cells may be connected to the third string select line SSL3, the fifth string select line SSL5 and the seventh string select line SSL7, respectively. The number of the additionally selected memory cells may be variously changed according to embodiments.

In some embodiments, the selected memory cell and some of the plurality of additionally selected memory cells may be commonly connected to the selected word line, and the others of the plurality of additionally selected memory cells may be connected to other word line. In this case, the selected memory cell and some of the plurality of additionally selected memory cells may be connected to different string select lines. In some embodiments, different word lines may be alternately disposed, and different string select lines may be alternately disposed.

For example, the selected memory cell and some of the plurality of additionally selected memory cells may be commonly connected to the first word line WL1, and the others of the plurality of additionally selected memory cells may be connected to the third word line WL3. In addition, the selected memory cell may be connected to the first string select line SSL1, and some of the plurality of additionally selected memory cells may be connected to the third string select line SSL3, the fifth string select line SSL5 and the seventh string select line SSL7, respectively. The number of the additionally selected memory cells may be variously changed according to embodiments.

In operation S430, the test program verify operation is performed on the selected memory cell. Specifically, the test program verify operation may be performed on the selected memory cell by applying a test program verify voltage to the selected word line to which the selected memory cell is connected. As described above, according to the present embodiment, while the test program operation is simultaneously performed on the selected memory cell and the additional selected memory cell, the test program verify operation is performed on only the selected memory cell.

In operation S440, it is determined whether the number of the test program loops is L. Operation S450 is performed when it is determined that the number of the test program loops is L. On the other hand, operations S420 and S430 are repeated when it is determined that the number of the test program loops is not L. As described above, according to the present embodiment, the test program operation may be simultaneously performed on the selected memory cell and the additionally selected memory cell with respect to only the L test program loops among the total N test program loops.

In operation S450, the test program operation is performed on the selected memory cell. Specifically, the test program operation may be performed on the selected memory cell by applying the test program voltage to the selected word line to which the selected memory cell is connected.

In operation S460, the test program verify operation is performed on the selected memory cell. Specifically, the test program verify operation may be performed on the selected memory cell by applying the test program verify voltage to the selected word line to which the selected memory cell is connected.

In operation S470, it is determined whether the test program has been completed, that is, the result of the test program verify operation is "test program pass". When the result of the test program verify operation is "test program pass", the test program operation is ended. On the other hand, operations S450 and S460 are repeated when the result of the test program verify operation is not "test program pass". As described above, according to the present embodiment, the test program operation and the test program verify operation may be performed on the selected memory cell in the (N−L) test program loops among the total N test program loops.

Figure 30:
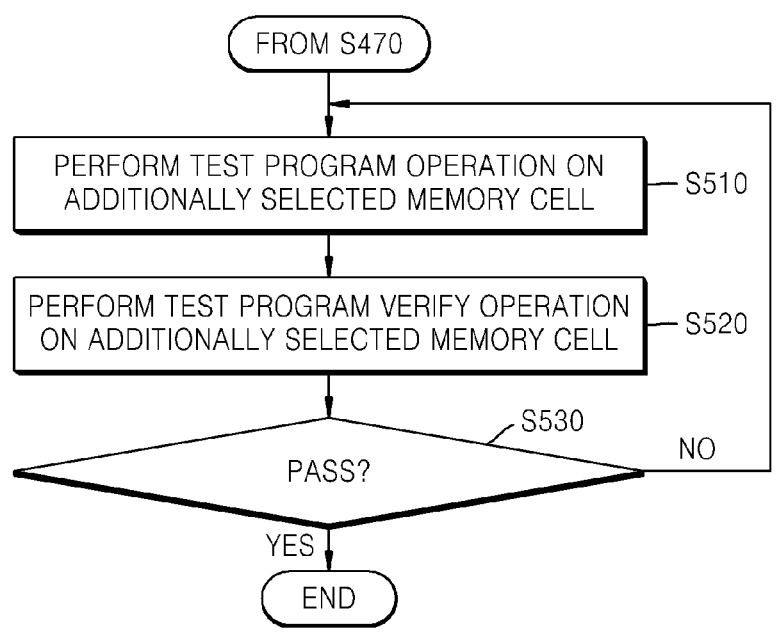
FIG. 30 is a flowchart of a method of testing a memory system according to an embodiment of the inventive concept.

FIG. 30 is a flowchart of a method of testing a memory system according to an embodiment of the inventive concept.

Referring to FIG. 30, the method of testing the memory system according to the present embodiment is a method of testing at least one additionally selected memory cell, including operations subsequent to operation S470 of FIG. 29.

In operation S510, a test program operation is performed on the additionally selected memory cell. Specifically, the test program operation may be performed on the additionally selected memory cell by applying a test program voltage to an additionally selected word line to which the additionally selected memory cell is connected.

In operation S520, a test program verify operation is performed on the additionally selected memory cell. Specifically, the test program verify operation may be performed on the additionally selected memory cell by applying a test program verify voltage to the additionally selected word line to which the additionally selected memory cell is connected.

In operation S530, it is determined whether the test program has been completed, that is, the result of the test program verify operation is "test program pass". Herein, M is a natural number equal to or greater than 1, and corresponds to N−L. When the result of the test program verify operation is "test program pass", the test program operation is ended. On the other hand, operations S510 and S520 are repeated when the result of the test program verify operation is not "test program pass". As described above, according to the present embodiment, when the selected memory cell passes in the N-th program loop and the additionally selected memory cell passes in the M-th program loop, the total number of the program loops is not (N+M) but (M+N−L). Therefore, a total program time may be decreased.

FIG. 31 is a diagram illustrating voltage conditions of the word lines and the string select lines of FIG. 10, according to the testing method of FIG. 30.

Referring to FIGS. 10 to 31, a selected page may be the first page PAGE1, and an additionally selected page may be the seventeenth page PAGE17. Therefore, a selected memory cell may be memory cells included in the first page PAGE1, and an additionally selected memory cell may be memory cells included in the seventeenth page PAGE17. In addition, N, L, and M may be 4, 2, and 2, respectively. Hereinafter, a test program operation for each page including the memory cells will be described.

Specifically, a page selected in a first test program operation, that is, first to fourth program loops LOOP1 to LOOP4, may be a first page PAGE1, and a page selected in a second test program operation, that is, the first and second program programs LOOP1 and LOOP2, may be the seventeenth page PAGE17. Since the test program operation may be simultaneously performed on the first and seventeenth pages PAGE1 and PAGE17 in the first and second program loops LOOP1 and LOOP2 among the first to fourth program loops LOOP1 to LOOP4, the test program operation according to the present embodiment may be regarded as a multi-test program operation.

First, the first test program operation, in which the selected page is the first page PAGE1, will be described below in detail.

In the first and second program loops LOOP1 and LOOP2, the test program operation may be simultaneously performed on the selected first page PAGE1 and the additionally selected seventeenth page PAGE17. Specifically, a test program voltage Vpgm may be applied to the first and third word lines WL1 and WL3, and an erase voltage Vera may be applied to the second word line WL2. In addition, an on-voltage Von may be applied to a first string select line SSL1, and an off-voltage Voff may be applied to a second string select line SSL2.

Furthermore, in the first and second program loops LOOP1 and LOOP2, a test program verify operation may be performed on only the selected first page PAGE1. Specifically, a test program verify voltage Vver may be applied to the first word line WL1, and a read voltage Vread may be applied to the second and third word lines WL2 and WL3. In addition, the on-voltage Von may be applied to the first string select line SSL1, and the off-voltage Voff may be applied to the second string select line SSL2.

In the third and fourth program loops LOOP3 and LOOP4, the test program operation may be performed on only the selected first page PAGE1. Specifically, the test program voltage Vpgm may be applied to the first word line WL1, and the erase voltage Vera may be applied to the second word line WL2. A pass voltage Vpass may be applied to the third word line WL3 In addition, the on-voltage Von may be applied to the first string select line SSL1, and the off-voltage Voff may be applied to the second string select line SSL2.

Furthermore, in the third and fourth program loops LOOP3 and LOOP4, the test program verify operation may be performed on only the selected first page PAGE1. Specifically, the test program verify voltage Vver may be applied to the first word line WL1, and the read voltage Vread may be applied to the second and third word lines WL2 and WL3. In addition, the on-voltage Von may be applied to the first string select line SSL1, and the off-voltage Voff may be applied to the second string select line SSL2.

Next, the second test program operation, in which the selected page is the seventeenth page PAGE17, will be described below in detail.

In the first and second program loops LOOP1 and LOOP2, the test program operation may be performed on only the selected seventeenth page PAGE17. Specifically, the test program voltage Vpgm may be applied to the third word line WL3, and the pass voltage Vpass may be applied to the first and second word lines WL1 and WL2. In addition, the on-voltage Von may be applied to the first string select line SSL1, and the off-voltage Voff may be applied to the second string select line SSL2.

Furthermore, in the first and second program loops LOOP1 and LOOP2, the test program verify operation may be performed on only the selected seventeenth page PAGE17. Specifically, the test program verify voltage Vver may be applied to the third word line WL3, and the read voltage Vread may be applied to the first and second word lines WL1 and WL2. In addition, the on-voltage Von may be applied to the first string select line SSL1, and the off-voltage Voff may be applied to the second string select line SSL2.

FIG. 32 is a diagram illustrating voltage conditions of the word lines and the string select lines of FIG. 10, according to another embodiment of the testing method of FIG. 30.

Referring to FIGS. 10 to 32, in the present embodiment, a selected page may be a first page PAGE1, and an additionally selected page may be a third page PAGE3. Therefore, a selected memory cell may be memory cells included in the first page PAGE1, and an additionally selected memory cell may be memory cells included in the third page PAGE3. In addition, N, L, and M may be 4, 2, and 2, respectively. Hereinafter, a test program operation for each page including the memory cells will be described.

Specifically, a page selected in a first test program operation, that is, the first to fourth program loops LOOP1 to LOOP4, may be the first page PAGE1, and a page selected in a second test program operation, that is, the first and second program programs LOOP1 and LOOP2, may be the third page PAGE3. Since the test program operation may be simultaneously performed on the first and third pages PAGE1 and PAGE3 in the first and second program loops LOOP1 and LOOP2 among the first to fourth program loops LOOP1 to LOOP4, the test program operation according to the present embodiment may be regarded as a multi-test program operation.

First, the first test program operation, in which the selected page is the first page PAGE1, will be described below in detail.

In the first and second program loops LOOP1 and LOOP2, the test program operation may be simultaneously performed on the selected first page PAGE1 and the additionally selected third page PAGE3. Specifically, a test program voltage Vpgm may be applied to the first word line WL1, and an erase voltage Vera may be applied to the second word line WL2. In addition, an on-voltage Von may be applied to the first and third string select lines SSL1 and SSL3, and an off-voltage Voff may be applied to the second string select line SSL2.

Furthermore, in the first and second program loops LOOP1 and LOOP2, a test program verify operation may be performed on only the selected first page PAGE1. Specifically, a test program verify voltage Vver may be applied to the first word line WL1, and a read voltage Vread may be applied to the second word line WL2. In addition, the on-voltage Von may be applied to the first string select line SSL1, and the off-voltage Voff may be applied to the second and third string select lines SSL2 and SSL3.

In the third and fourth program loops LOOP3 and LOOP4, the test program operation may be performed on only the selected first page PAGE1. Specifically, the test program voltage Vpgm may be applied to the first word line WL1, and the erase voltage Vera may be applied to the second word line WL2. In addition, the on-voltage Von may be applied to the first string select line SSL1, and the off-voltage Voff may be applied to the second and third string select lines SSL2 and SSL3.

Furthermore, in the third and fourth program loops LOOP3 and LOOP4, the test program verify operation may be performed on only the selected first page PAGE1. Specifically, the test program verify voltage Vver may be applied to the first word line WL1, and the read voltage Vread may be applied to the second word line WL2. In addition, the on-voltage Von may be applied to the first string select line SSL1, and the off-voltage Voff may be applied to the second and third string select lines SSL2 and SSL3.

Next, the second test program operation, in which the selected page is the third page PAGE3, will be described below in detail.

In the first and second program loops LOOP1 and LOOP2, the test program operation may be performed on only the selected third page PAGE3. Specifically, the test program voltage Vpgm may be applied to the first word line WL1, and the erase voltage Vera may be applied to the second word line WL2. In addition, the on-voltage Von may be applied to the third string select line SSL3, and the off-voltage Voff may be applied to the first and second string select lines SSL1 and SSL2.

Furthermore, in the first and second program loops LOOP1 and LOOP2, the test program verify operation may be performed on only the selected third page PAGE3. Specifically, the test program verify voltage Vver may be applied to the first word line WL1, and the erase voltage Vera may be applied to the second word line WL2. In addition, the on-voltage Von may be applied to the third string select line SSL3, and the off-voltage Voff may be applied to the first and second string select lines SSL1 and SSL2.

Figure 33:
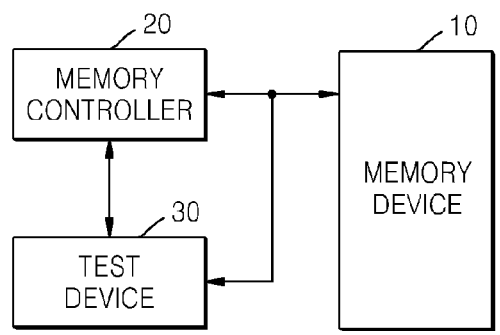
FIG. 33 is a schematic block diagram of a memory system according to an embodiment of the inventive concept.

FIG. 33 is a schematic block diagram of a memory system 3 according to another embodiment of the inventive concept.

Referring to FIG. 33, the memory system 3 may include a memory device 10, a memory controller 20, and a test device 30. In the memory system 3 of FIG. 33, the memory device 10 is substantially the same as the memory device 10 of FIG. 1, the memory controller 20 is substantially the same as the memory controller 20 of FIG. 1, and the test device 30 is substantially the same as the test device 30 of FIG. 28. Therefore, detailed descriptions of the respective elements will be omitted.

According to the present embodiment, the memory controller 20 and the test device 30 are included in the memory system 3, thus improving efficiencies of a program operation and a test program operation on the memory device 10.

Figure 34:
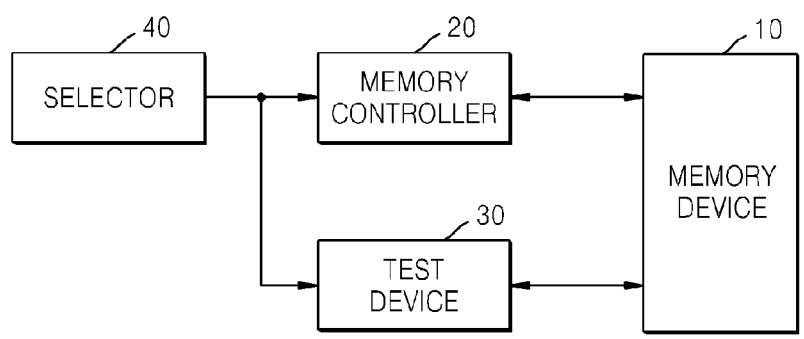
FIG. 34 is a schematic block diagram of a memory system according to an embodiment of the inventive concept.

FIG. 34 is a schematic block diagram of a memory system 4 according to another embodiment of the inventive concept.

Referring to FIG. 34, the memory system 4 may include a memory device 10, a memory controller 20, a test device 30, and a selector 40. In the memory system 4 of FIG. 34, the memory device 10 is substantially the same as the memory device 10 of FIG. 1, the memory controller 20 is substantially the same as the memory controller 20 of FIG. 1, and the test device 30 is substantially the same as the test device 30 of FIG. 28. Therefore, detailed descriptions of the respective elements will be omitted.

The selector 40 may selectively connect the memory controller 20 or the test device 30 to the memory device 10 in response to a select signal provided from a host (not illustrated). According to the present embodiment, the memory controller 20, the test device 30, and the selector 40 are included in the memory system 4, thus improving efficiencies of a program operation and a test program operation on the memory device 10.

Figure 35:
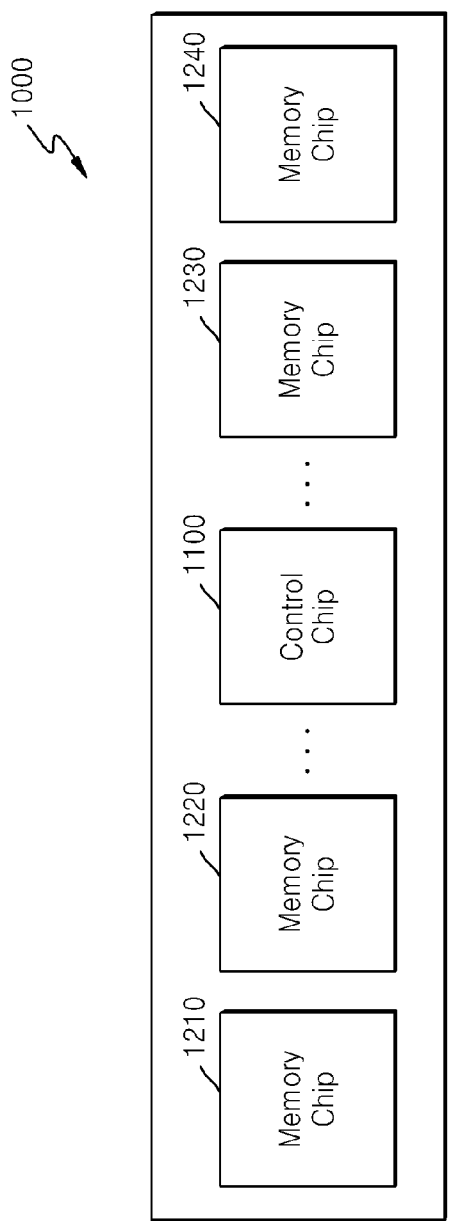
FIG. 35 is a schematic block diagram of a memory module according to an embodiment of the inventive concept.

FIG. 35 is a schematic block diagram of a memory module 1000 according to an embodiment of the present disclosure.

Referring to FIG. 35, the memory module 1000 may include memory chips 1210, 1220, 1230 and 1240, and a control chip 1100. The memory chips 1210 to 1240 may store data. For example, each of the memory chips 1210 to 1240 may be the memory device 10 of FIG. 1. The control chip 1100 may control the memory chips 1210 to 1240 in response to various signals received from an external memory controller. For example, the control chip 1100 may enable the memory chips 1210 to 1240 in response to a chip select signal received from an external device, and may perform error check and correction operations on data read from the respective memory chips 1210 to 1240.

According to embodiments of the inventive concept, a multi-program operation may be performed on the respective memory chips 1210 to 1240. Therefore, the contents described with reference to FIGS. 1 to 34 may also be applied to the memory module 1000 according to the present embodiment.

Figure 36:
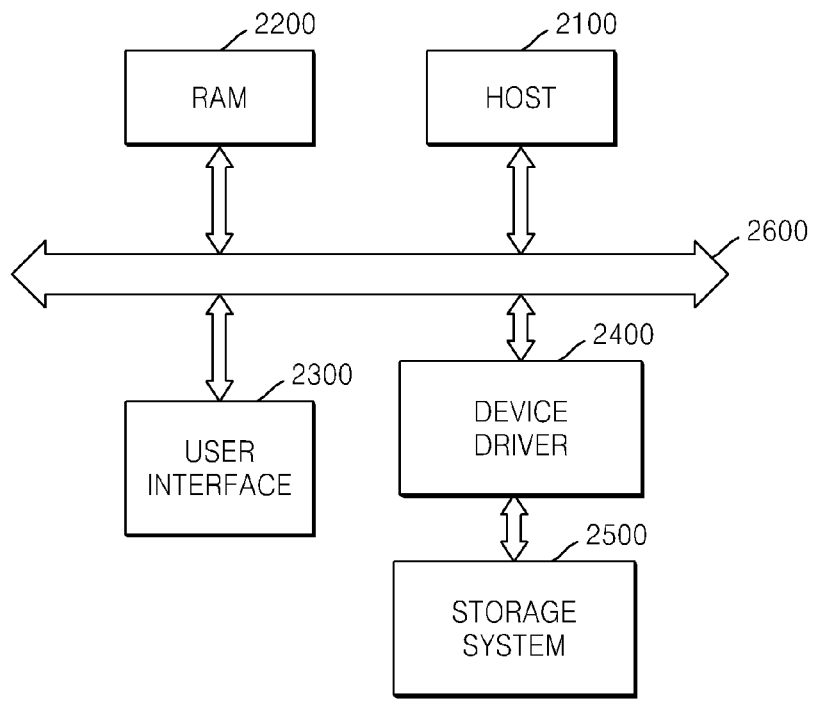
FIG. 36 is a block diagram of a computing system including a memory system, according to an embodiment of the inventive concept.

FIG. 36 is a block diagram of a computing system 2000 including a memory system, according to an embodiment of the inventive concept.

Referring to FIG. 36, the computing system 2000 may be a mobile device or a desktop computer. The computing system 2000 may include a host 2100 with a central processing unit (CPU), a random access memory (RAM) 2200, a user interface 2300, and a device driver 2400, which are electrically connected to a bus 2600. A non-volatile storage system 2500 may be connected to the device driver 2400.

The host 2100 may control the overall operation of the computing system 2000 and may perform an arithmetic operation corresponding to a user command input through the user interface 2300. The RAM 2200 may serve as a data memory of the host 2100, and the host 2100 may read user data from the non-volatile storage system 2500 or write the user data to the non-volatile storage system 2500 through the device driver 2400.

In addition, the device driver 2400 for controlling an operation and management of the non-volatile storage system 2500 is illustrated as being provided outside the host 2100, but the device driver 2400 may be provided inside the host 2100. The non-volatile storage system 2500 may include the memory device 10 of FIG. 1. Therefore, the contents described with reference to FIGS. 1 to 24 may also be applied to the computing system 2000 according to the present embodiment.

Figure 37:
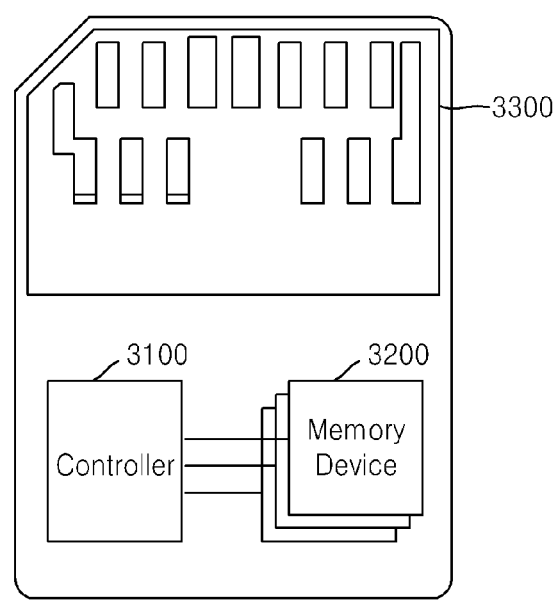
FIG. 37 is a schematic diagram of a memory card according to an embodiment of the inventive concept.

FIG. 37 is a schematic diagram of a memory card according to an embodiment of the inventive concept.

Referring to FIG. 37, the memory card 3000 may be a portable storage device that may be used when connected to an electronic device, such as a mobile device or a desktop computer. Referring to FIG. 37, the memory card 3000 may include a controller 3100, a memory device 3200, and a port 3300.

The memory card 3000 may communicate with an external host (not illustrated) through the port 3300. The controller 3100 may control the memory device 3200. The controller 3100 may read a program from a ROM (not illustrated) that stores programs, and the controller 3100 may execute the program.

Figure 38:
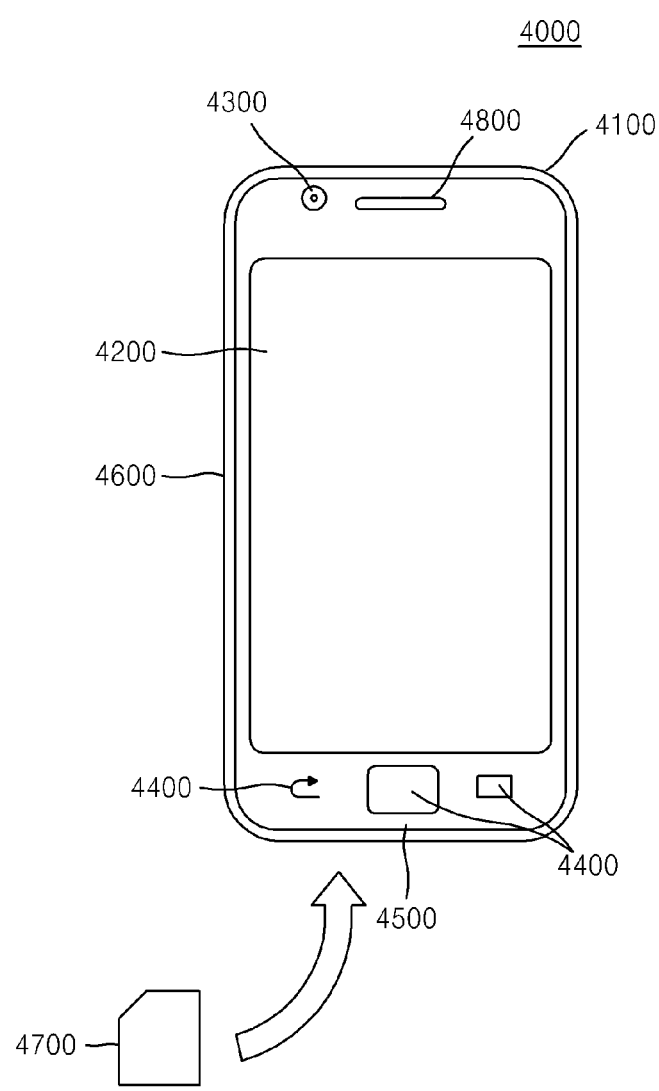
FIG. 38 is an exemplary diagram of a mobile terminal including a memory system, according to an embodiment of the inventive concept.

FIG. 38 is an exemplary diagram of a mobile terminal 4000 including a memory system, according to an embodiment of the inventive concept.

Referring to FIG. 38, the memory systems 1, 3 and 4 according to the embodiments of the inventive concept may be mounted in the mobile terminal 4000. The mobile terminal 4000 may be a smartphone, the functions of which are not limited, and may be modified or extended through application programs. The mobile terminal 4000 may include an internal antenna 4100 through which the mobile terminal 4000 may exchange RF signals with a radio base station. The mobile terminal 4000 may include a display 4200 that displays images that are captured by a camera 4300 or images that are received by the internal antenna 4100 and decoded. Examples of the display 4200 may include a liquid crystal display (LCD) or an organic light-emitting diode (OLED).

The mobile terminal 4000 may include an operation panel 4400 with a control button and a touch panel. Furthermore, when the display 4200 is a touchscreen, the operation panel 4400 may further include a touch sense panel of the display 4200. The mobile terminal 4000 may include a speaker 4800 or other type of a sound output unit which outputs voices and sounds, and a microphone 4500 or other type of a sound input unit which receives voices and sounds.

The mobile terminal 4000 may further include the camera 4300, such as a charge coupled device (CCD) camera, which captures videos and still images. Moreover, the mobile terminal 4000 may include a storage medium 4700 and a slot 4600. The storage medium 4700 stores encoded or decoded data, such as videos or still images that are captured by the camera 4300, are received via an E-mail, or are acquired in other types. The storage medium 4700 may be mounted in the mobile terminal 4000 through the slot 4600. The storage medium 4700 embedded with the memory device 10 of FIG. 1 may be implemented.

While the inventive concept has been particularly shown and described with reference to exemplary embodiments thereof, it will be understood that various changes in form and details may be made therein without departing from the spirit and scope of the following claims.

What is claimed is:

1. A method of programming a memory system, comprising:
    repetitively performing N program loops for a selected memory cell, where N is a natural number equal to or greater than two, each of the N program loops including a program operation and a program verify operation,
    wherein at least one of the N program loops comprises
        performing the program operation on the selected memory cell and at least one additionally selected memory cell by applying a first voltage to at least one word line to which the selected memory cell and the at least one additionally selected memory cell are connected; and
        performing the program verify operation on the selected memory cell by applying a second voltage to a selected word line to which the selected memory cell is connected, and
    wherein during program loops of the N program loops other than the at least one of the N program loops, a further program operation and a further program verification operation are performed only on the selected memory cell.

2. The method of claim 1, wherein the at least one word line comprises:
    the selected word line to which the selected memory cell is connected; and
    at least one additionally selected word line to which the at least one additionally selected memory cell is connected.

3. The method of claim 2, wherein the selected word line and the at least one additionally selected word line are not disposed adjacent to each other.

4. The method of claim 2, wherein the selected word line and the at least one additionally selected word line are disposed adjacent to each other.

5. The method of claim 1, wherein the selected memory cell and the at least one additionally selected memory cell are commonly connected to the selected word line, and the performing of the program operation comprises applying a third voltage to a plurality of string select lines to which the selected memory cell and the at least one additionally selected memory cell are connected.

6. The method of claim 5, wherein the plurality of string select lines comprise a selected string select line to which the selected memory cell is connected, and at least one additionally selected string select line to which the at least one additionally selected memory cell is connected, and
the performing of the program verify operation comprises applying the third voltage to the selected string select line and applying a fourth voltage to the at least one additionally selected string select line.

7. The method of claim 6, wherein the selected string select line and the at least one additionally selected string select line are not disposed adjacent to each other.

8. The method of claim 6, wherein the selected string select line and the at least one additionally selected string select line are disposed adjacent to each other.

9. The method of claim 1, wherein the at least one additionally selected memory cell includes two or more additionally selected memory cells,
the at least one word line comprises the selected word line to which the selected memory cell and at least one memory cell among the two or more additionally selected memory cells are connected, and at least one additionally selected word line to which remaining memory cells other than the at least one memory cell among the two or more additionally selected memory cells are connected, and
the performing of the program operation comprises applying a third voltage to a plurality of string select lines to which the selected memory cell and the two or more additionally selected memory cells are connected.

10. The method of claim 9, wherein the plurality of string select lines comprise a selected string select line to which the selected memory cell is connected, and at least one additionally selected string select line connected to one or more memory cells among the two or more additionally selected memory cells, and
the performing of the program verify operation comprises applying the third voltage to the selected string select line, and applying a fourth voltage to the at least one additionally selected string select line.

11. The method of claim 1, wherein the program loops of the N program loops other than the at least one of the N program loops comprise:
performing the further program operation on the selected memory cell by applying the first voltage to the selected word line; and
performing the further program verify operation on the selected memory cell by applying the second voltage to the selected word line.

12. The method of claim 1, further comprising, when the N program loops for the selected memory cell are completed, repetitively performing M program loops on the at least one additionally selected memory cell,
wherein when the program operation is performed on the selected memory cell and the at least one additionally selected memory cell L times, M is equal to (N−L).

13. A method of programming a memory system, comprising:
repetitively performing N program loops for a selected memory cell, where N is a natural number equal to or greater than two, each of the N program loops including a program operation and a program verify operation,
wherein at least one of the N program loops comprises
performing the program operation on the selected memory cell and at least one additionally selected memory cell by applying a first voltage to at least one word line to which the selected memory cell and the at least one additionally selected memory cell are connected; and
performing the program verify operation on the selected memory cell by applying a second voltage to a selected word line to which the selected memory cell is connected, and
wherein program loops other than the at least one of the N program loops comprise
performing the program operation on the at least one additionally selected memory cell by applying the first voltage to at least one additionally selected word line to which the at least one additionally selected memory cell is connected, the at least one word line including the selected word line and the at least one additionally selected word line;
performing the program verify operation on the at least one additionally selected memory cell by applying the second voltage to the at least one additionally selected word line;
performing a re-program operation on the selected memory cell by applying the first voltage to the selected word line; and
performing a re-program verify operation on the selected memory cell by applying the second voltage to the selected word line.

14. The method of claim 1, wherein as a number of the program loops increases, the first voltage increases stepwise by a step voltage.

15. A method of testing a memory system, comprising:
applying a first voltage to at least one word line to which a first memory cell and at least one additional memory cell are connected, the at least one word line including a first word line to which the first memory cell is connected;
applying a second voltage to a plurality of string select lines to which the first memory cell and the at least one additional memory cell are connected, the plurality of string select lines including a first string select line to which the first memory cell is connected and at least one additional string select line to which the at least one additional memory cell is connected;
applying a third voltage to the first word line; and
applying the third voltage to the first string select line, and applying a fourth voltage to the at least one additional string select line,
wherein the at least one word line further comprises at least one additional word line to which the at least one additional memory cell is connected, and
the first word line and the at least one additional word line are alternately disposed.

16. A memory system comprising:
a memory device including a first memory cell and at least one additional memory cell; and
a memory controller configured to control the memory device so that at least one of N program loops for a selected memory cell includes a program operation simultaneously performed on the first memory cell and the at least one additional memory cell, and a program verify operation performed on only the first memory cell, N being a natural number equal to or greater than two, and at least one other of the N program loops includes a program operation and a program verify operation performed only on the first memory cell.

17. The memory system of claim 16, wherein the memory controller comprises a read/write control unit configured to provide an address of the first memory cell, an address of the at least one additional memory cell and a program command in the program operation, and configured to provide the address of the first memory cell and a program verify command in the program verify operation.

18. The memory system of claim 17, wherein when the N program loops for the first memory cell are completed, the read/write control unit is configured to provide the address of the at least one additional memory cell and the program command in a next program operation, and configured to provide the address of the at least one additional memory cell and the program verify command in a next program verify operation.

19. The method of claim 15, further comprising:
applying a fifth voltage to the first word line; and
applying a sixth voltage to the first word line.

20. The method of claim 15, further comprising:
applying a seventh voltage to the at least one additional word line; and
applying an eighth voltage to the at least one additional word line.

\* \* \* \* \*